(12) United States Patent
Reid et al.

(10) Patent No.: US 7,256,467 B2
(45) Date of Patent: Aug. 14, 2007

(54) MATERIALS AND METHODS FOR FORMING HYBRID ORGANIC-INORGANIC ANTI-STICTION MATERIALS FOR MICRO-ELECTROMECHANICAL SYSTEMS

(75) Inventors: Jason S. Reid, Los Gatos, CA (US); Nungavram S. Viswanathan, San Jose, CA (US)

(73) Assignee: Silecs Oy, Espoo (FI)

( * ) Notice: Subject to any disclaimer, the term of this patent is extended or adjusted under 35 U.S.C. 154(b) by 162 days.

(21) Appl. No.: 10/453,933

(22) Filed: Jun. 4, 2003

(65) Prior Publication Data

US 2004/0012061 A1 Jan. 22, 2004

Related U.S. Application Data

(60) Provisional application No. 60/385,620, filed on Jun. 4, 2002.

(51) Int. Cl.
*H01L 21/00* (2006.01)
*H01L 29/82* (2006.01)

(52) U.S. Cl. .............. 257/415; 257/417; 257/419; 257/420; 257/40; 257/642; 257/750; 257/759

(58) Field of Classification Search ............ 257/412, 257/417, 414, 415, 638, 639, 641, 642
See application file for complete search history.

(56) References Cited

U.S. PATENT DOCUMENTS

| | | | | |
|---|---|---|---|---|
| 4,736,048 A | * | 4/1988 | Brown et al. ............... | 556/454 |
| 4,889,753 A | * | 12/1989 | Brown et al. ............... | 428/40.7 |
| 5,482,564 A | | 1/1996 | Douglas et al. .............. | 134/18 |
| 5,523,878 A | | 6/1996 | Wallace et al. ............ | 359/290 |
| 6,051,321 A | * | 4/2000 | Lee et al. ................... | 428/447 |
| 6,365,229 B1 | | 4/2002 | Robbins ................... | 427/248.1 |
| 6,508,979 B1 | * | 1/2003 | Requicha et al. ............... | 419/7 |
| 6,674,140 B2 | * | 1/2004 | Martin ...................... | 257/415 |
| 2001/0053016 A1 | | 12/2001 | Nelson ...................... | 359/291 |
| 2002/0086101 A1 | | 7/2002 | Jacobs ........................ | 427/58 |
| 2003/0161949 A1 | | 8/2003 | Ashurst et al. ........... | 427/248.1 |
| 2004/0026775 A1 | * | 2/2004 | Hecht et al. ................. | 257/701 |

FOREIGN PATENT DOCUMENTS

WO      WO 02/33749      * 4/2002

OTHER PUBLICATIONS

Dutoit, B.M. et al. "Self-assembled Real Monolayer coating to improve release of MEMS Structures", Transducers '03, The 12th International Conference on Solid State Sensors, Actuators and Microsystems, Boston, Jun. 8-12, 2003, pp. 810-812.

(Continued)

*Primary Examiner*—Evan Pert
*Assistant Examiner*—Fazli Erdem
(74) *Attorney, Agent, or Firm*—Kubovcik & Kubovcik

(57) ABSTRACT

A micro-electromechanical device is formed on a substrate. The device has sliding, abrading or impacting surfaces. At least one of these surfaces is covered with an anti-stiction material. The anti-stiction material is provided from a slicon compound precursor (e.g. silane, silanol) or multiple silicon compound precursors. Preferably the precursor(s) is fluorinated—more preferably perfluorinated, and is deposited with a solvent as a low molecular weight oligomer or in monomeric form. Examples include silanes (fluorinated or not) with aromatic or polycyclic ring sturctures, and/or silanes (fluorinated or not) having alkenyl, alkynyl, epoxy or acrylate groups. Mixtures either or both of these groups with alkyl chain silanes (preferably fluorinated) are also contemplated.

5 Claims, 2 Drawing Sheets

OTHER PUBLICATIONS

Ashurst, W.R. et al., "Wafer Level Anti-Stiction Coatings with Superior Thermal Stability", Proceedings of Solid-State Sensor, Actuator and Microsystems Workshop, Hilton Head Island, SC, 2002, pp. 142-145.

Mastrangelo, C.H., "Suppression of stiction in MEMS", 1999 Fall MRS Meeting, Boston, Nov. 28-Dec. 2, 1999, pp. 1-12.

Srinivason, U. et al. "Alkyltrichlorosilane-Based Self-Assembled Monolayer Films for Stiction Reduction in Silicon Micromachines", Journal of Microelectromechanical Systems, vol. 7, No. 2, Jun. 1998, pp. 252-260.

* cited by examiner

US 7,256,467 B2

MATERIALS AND METHODS FOR FORMING HYBRID ORGANIC-INORGANIC ANTI-STICTION MATERIALS FOR MICRO-ELECTROMECHANICAL SYSTEMS

This application claims priority under 35 USC 119 to U.S. provisional patent application Ser. No. 60/385,620 filed Jun. 4, 2002, the subject matter of which is incorporated herein by reference.

BACKGROUND OF THE INVENTION

The present invention generally relates to methods and materials for micro-electromechanical systems (MEMS), and in particular for surface coating MEMS devices to decrease stiction. Stiction is the phenomenon of the sticking or adhering of two contacting surfaces (sliding, impacting etc) in MEMS devices. It is a serious problem that causes early failure of such devices. Some known anti-stiction materials for MEMS devices include perfluorpolyethers, perfluorodecanoic acid, diamond like carbon and Teflon-type materials.

SUMMARY OF THE INVENTION

The present invention is directed generally to methods for making anti-stiction materials for semiconductor devices. The invention is directed to utilizing specific precursors so as to reliably control such methods for making the anti-stiction materials. In one embodiment, a MEMS device is made by depositing and patterning layers on a sacrificial layer, followed by releasing the MEMS device by removing the sacrificial layer, followed by application of the anti-stiction material of the present invention. The MEMS device of the present invention can be any MEMS device, including but not limited to a microrelay, micromirror, microvalve, accelerometer, etc.

In one embodiment, the present invention is directed to a method for forming a hybrid organic inorganic layer on a MEMS device (or within a MEMS device package), comprising: hydrolyzing a silane selected from the group consisting of a tetraalkoxysilane, a trialkoxysilane, a trichlorosilane, a dialkoxysilane, and a dichlorosilane, with a compound of the general formula: $R^1R^2R^4MR^5$, wherein $R^1$, $R^2$ and $R^4$ are independently an aryl, alkyl, alkenyl, epoxy or alkynyl group, wherein at least one of $R^1$, $R^2$ and $R^4$ is fully or partially fluorinated, wherein M is selected from group 14 of the periodic table, and wherein $R^5$ is either an alkoxy group, $OR^3$, or a halogen, X—followed by depositing the material on the MEMS device or within the MEMS device package. In various embodiments, $OR^3$ can have one to 10 carbons, one to 7 carbons, and more preferably one to five carbons, and the like. In another embodiment of the present invention a compound of the general formula $R^1{}_{4-m}SiOR^3{}_m$ wherein m is an integer from 2 to 4, $OR^3$ is an alkoxy, acyl or acyloxy group, is reacted with a compound of the general formula $R^2X^2+Mg$, wherein $X^2$ is Br or I; where $R^1$ and $R^2$ are independently selected from alkyl, alkenyl, aryl, alkynyl or epoxy, and at least one of $R^1$ and $R^2$ is partially or fully fluorinated. A coating compound is made of the general formula $R^2R^1{}_{4-m}SiOR^3{}_{m-1}$ with a molecular weight between 3000 and 100,000. This is then followed by reacting $R^2R^1{}_{4-m}SiOR^3{}_{m-1}$ with a halogen or halogen compound in order to replace one or more $OR^3$ groups with a halogen. This reaction forms $R^2R^1{}_{4-m}SiOR^3{}_{m-1-n}X_n$, where X is a halogen and n is from 1 to 3 and m>n, except where $R^1$ is fluorinated phenyl and $OR^3$ is ethoxy. A lower molecular weight, or monomers of the above, are preferred.

DESCRIPTION OF THE PREFERRED EMBODIMENTS

In one embodiment of the present invention, hybrid organic-inorganic materials are used for anti-stiction purposes on MEMS device or in device packages. In this embodiment, the hybrid materials of the invention can provide the benefits of reducing the sticking forces between sliding or contacting surfaces in the MEMS device. The anti-stiction material can have an inorganic backbone, including but not limited to one that is made of a metal or metalloid oxide three dimensional network, and the like, with organic substituents and cross linking groups, that can be partially or fully fluorinated. In another embodiment, minimal or no cross linking via organic substitutents takes place and only inorganic cross linking (e.g. —Si—O—Si—O—) takes place after deposition of monomeric or low molecular weight polymeric solutions on the MEMS device.

Figure 1:
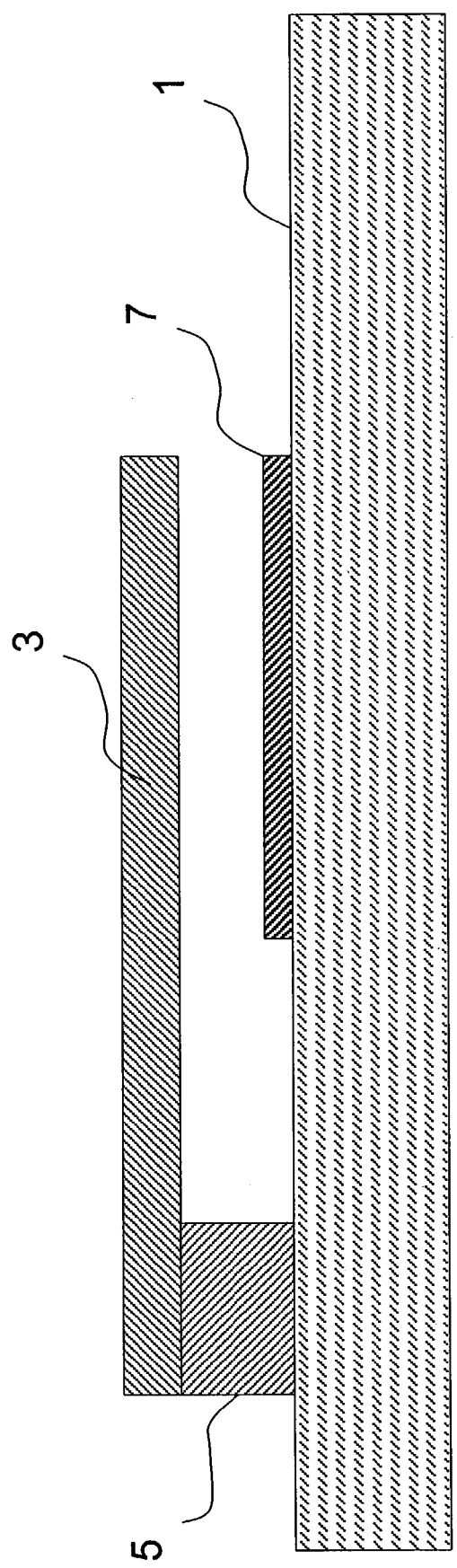
FIG. 1 is a cross section of a micro-electromechanical device.

The MEMS device of the present invention can be any microelectromechanical device—preferably one that has abrading or impacting surfaces where stiction would occur. The mode of operation can be any desired, such as piezoelectric, magnetic or electrostatic. As an example, as can be seen in FIG. 1, a MEMS structural element 3 is held on a substrate 1 by post 5. The substrate 1 can be any suitable substrate such as a semiconductor substrate (e.g. Si or GaAs). Post 5 is formed by depositing a sacrificial layer (not shown) and patterning such a layer to form apertures that are filled in by a subsequently deposited layer. At least part of post 5 is preferably electrically conductive, as is at least part of movable sturctureal element 3. On substrate 1 is circuitry (not shown) and an electrode that is capable of electrostatically attracting the MEMS structural element 3. MEMS movable element 3 deflects and impacts electrode 7 or, preferably an adjacent structure that is at the same potential as structural element 3.

Figure 2:
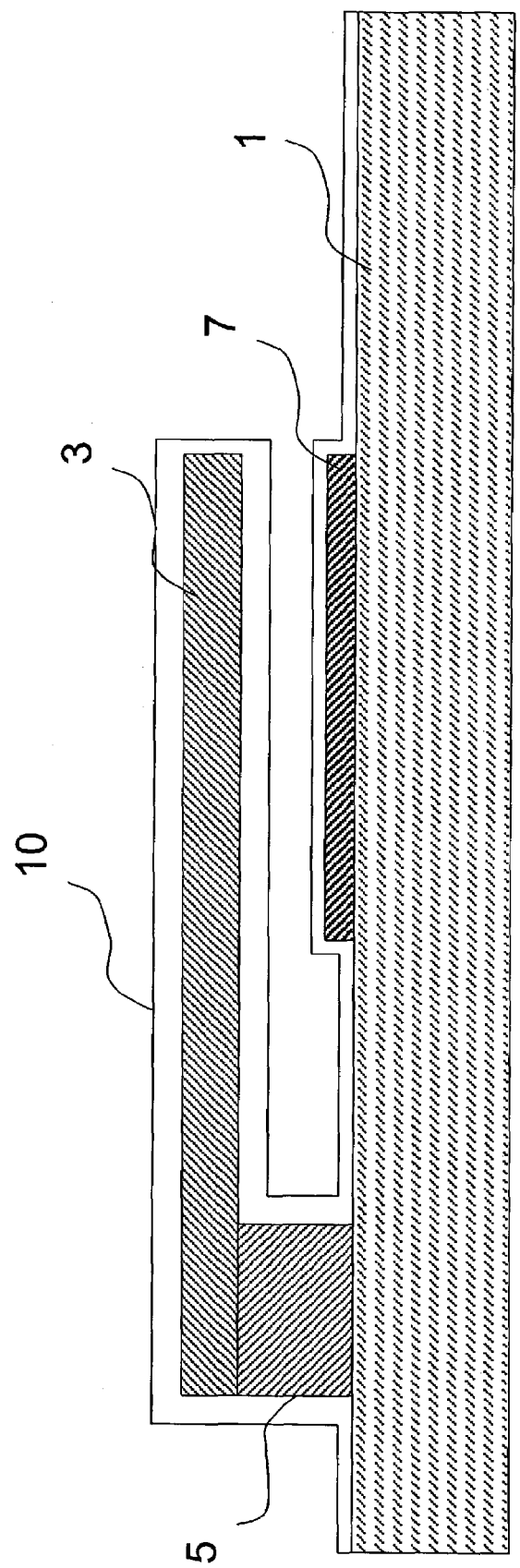
FIG. 2 is a cross section of a coated micro-electromechanical device.

The impact of element 3 on other structure within the device can cause stiction problems—problems that result from sticking forces between two impacting structures in a MEMS device. As can be seen in FIG. 2, a surface layer 10 is deposited that reduces such sticking forces between the impacting structures. Though it is preferred that the anti-stiction coating is provided on both surfaces, it can be provided on only one of the impacting surfaces if desired. As will be discussed in more detail herein, anti-stiction coating 10 is preferably hydrophobic, prefeably partially or fully fluorinated, preferably a hybrid organic-inorganic material, and is preferably deposited with a solvent as a monomer, mixture of different monomers, or as a low molecular weight oligomer or polymer. The layer 10 can be a self assembled monolayer, or it can be a thicker layer formed from three dimensional cross linking of the deposited material. A fluorinated solvent can be used for depositing layer 10.

COMPOUNDS

There are many different silicon compounds suitable for use in the present invention. Preferred are those that are fluorinated, preferably perfluorinated—or, where multiple different silicon compounds are used, where at least one of the compounds is fluorinated, preferably perfluorinated— and more preferably, when multiple different silicon compounds are used, all are at least partially fluorinated or even all perfluorinated.

In this section, compounds are described that can be hydrolyzed and condensed (alone or with one or more other compounds) into a hybrid organic-inorganic anti-stiction material having a molecular weight of from 500 to 100,000. The molecular weight can be in the lower end of this range (e.g., from 500 to 5,000, or more preferably 500 to 3,000) or the anti-stiction material can have a molecular weight in the upper end of this range (such as from 5,000 to 100,000 or from 10,000 to 50,000). In addition, it may be desirable to mix an anti-stiction material having a lower molecular weight with an anti-stiction material having a higher molecular weight. The anti-stiction material can be suitably deposited such as by spin-on, spray coating, dip coating, or the like. Such compounds are preferably partially or fully fluorinated, though not necessarily so. The compounds will preferably have an element M selected from groups 3-6 or 13-16 of the periodic table, which element is preferably tetra-valent, such as those elements selected from group 14 of the periodic table. Connected to this element M are four substituents (if tetra-valent), wherein from one to three of these substituents are organic groups to be discussed further below, with the remainder being a halogen, alkoxy, acyl, acyloxy or —OH group.

Compound Example I

A compound is provided of the general formula: $R^1MOR^3{}_3$, where $R^1$ is any partially or fully fluorinated organic group (preferably a partially or fully fluorinated aryl, alkenyl, alkynyl or alkyl group), where M is an element selected from column 14 of the periodic table, and where $OR^3$ is an alkoxy group, $R^1$ is perfluorinated phenyl or perfluorinated vinyl. $R^1$ can have an inorganic component, though if so, a portion should preferably be a partially or fully fluorinated organic component. In various embodiments, $OR^3$ can have one to 12 carbons, one to 7 carbons, and more preferably one to five carbons, and the like. The carbon chain R can be linear, branched or cyclic. In a more preferred example of this, $R^1$ comprises a double bond that is capable of physical alteration or degradation in the presence of an electron beam, or electromagnetic radiation and a photoinitiator (or sensitizer, photoacid or thermal initiator—to be discussed further below). In this example, $R^1$ could be an alkenyl group such as a vinyl group, or could be an epoxy or acrylate group, that is preferably partially or fully fluorinated. Such a group, as will be discussed further herein, can allow for crosslinking upon application of an electron beam or preferably electromagnetic radiation (e.g., directing ultraviolet light through a mask with the material comprising a photoinitiator). In the alternative, $R^1$ could be an organic group that is (or an anti-stiction organic-inorganic group that comprises) a single or multi ring structure (an "aryl group") or an alkyl group of any length, such as from 1 to 14 carbon atoms or longer (preferably 4-10)—the alkyl group capable of being a straight or branched chain. If $R^1$ is a ring structure, or a carbon chain of sufficient length (e.g., 4 (or 5) or more carbons), then such an $R^1$ group can provide bulk to the final material once hydrolyzed, condensed and deposited on a substrate. If $R^1$ is a ring structure, whether single ring or multi ring, aromatic or aliphatic, it can have substituents thereon, fluorinated, though not necessarily, such as alkyl or alkenyl substituents (preferably from 1 to 5 carbons), and where the substituents on the ring structure can be at from 1 to 3 location around the ring. $R^1$ can be a 4 to 8 sided ring structure (preferably 5 or 6 sided) which ring structure could comprise N or O. $R^1$ could comprise nitrogen, or $R^1$ can also have an oxygen component, such as a carboxylate group (e.g., acrylate, butenecarboxylate, propenecarboxylate, etc.).

For purposes of this disclosure. The term 'alkenyl' as used herein includes straight-chained and branched alkenyl groups, such as vinyl and allyl groups. The term 'alkynyl' as used herein includes straight-chained and branched alkynyl groups, suitably acetylene. 'Aryl' means a mono-, bi-, or more cyclic aromatic carbocyclic group; examples of aryl are phenyl and naphthyl. More specifically the alkyl, alkenyl or alkynyl may be linear or branched. Alkyl contains preferably 1 to 18, more preferably 1 to 14 and particularly preferred 1 to 12 carbon atoms. The alkyl is preferably branched at the alpha or beta position with one and more, preferably two, C1 to C6 alkyl groups, especially preferred per-fluorinated alkyl, alkenyl or alkynyl groups. Some examples are non-fluorinated, partially fluorinated and per-fluorinated i-propyl, t-butyl, but-2-yl, 2-methylbut-2-yl, and 1,2-dimethylbut-2-yl. Alkenyl contains preferably 2 to 18, more preferably 2 to 14 and particularly preferred 2 to 12 carbon atoms. The ethylenic, i.e., two carbon atoms bonded with double bond, group is preferably located at the position 2 or higher, related to the Si or M atom in the molecule. Branched alkenyl is preferably branched at the alpha or beta position with one and more, preferably two, C1 to C6 alkyl, alkenyl or alkynyl groups, particularly preferred per-fluorinated alkyl, alkenyl or alkynyl groups.

For purposes of this specification, alkynyl contains preferably 3 to 18, more preferably 3 to 14 and particularly preferred 3 to 12 carbon atoms. The ethylinic group, i.e., two carbon atoms bonded with triple bond, group is preferably located at the position 2 or higher, related to the Si or M atom in the molecule. Branched alkynyl is preferably branched at the alpha or beta position with one and more, preferably two, C1 to C6 alkyl, alkenyl or alkynyl groups, particularly preferred per-fluorinated alkyl, alkenyl or alkynyl groups.

Alkoxy, acyl, acyloxy herein have meanings that are understood by the persons skilled in the art, and include straight and branched chains.

In the context of this specification, the organic group substituent halogen may also be F, Cl, Br or I atom and is preferably F or Cl. Generally, term 'halogen' herein means a fluorine, chlorine, bromine or iodine atom.

In the example above, in $R^1MOR^3{}_3$, M can be a tetravalent element from column 14 of the periodic table (e.g., Si or Ge), or a tetravalent element from column 16—e.g., Se (or a tetravalent early transition metal—such as titanium or zirconium). Also, $OR^3$ is an alkoxy group, though preferably one having from 1 to 4 carbon atoms (longer alkoxy groups can be used, but are more expensive).

Specific examples include:

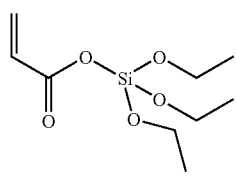

Acryltriethoxysilane

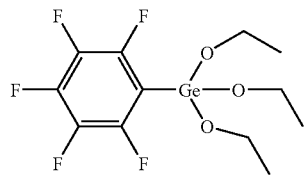

Pentafluorophenyltriethoxygermane

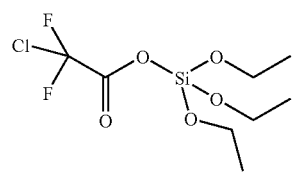

Chlorodifuoroacetic acid, triethoxy silyl ester

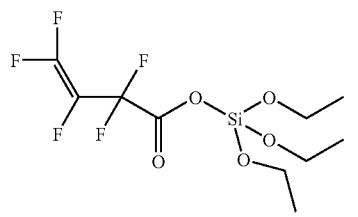

Perfluoro-3-butene acid, triethoxysilyl ester

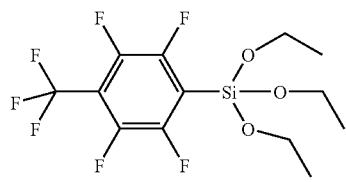

4-triethoxysilyl perfluorostyrene

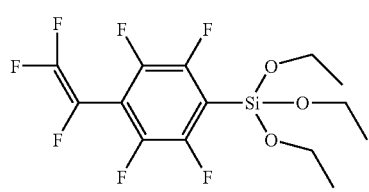

Heptafluorotoluenetriethoxysilane

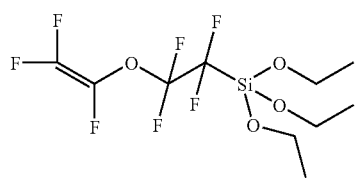

Tetrafluoroethyltrifluorovinyl ether triethoxysilane

-continued

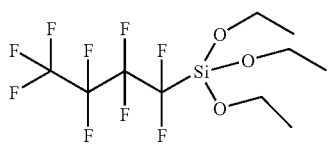

Perfluorobutanetriethoxysilane

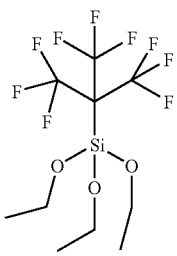

Perfluoro-t-butyl triethoxysilane

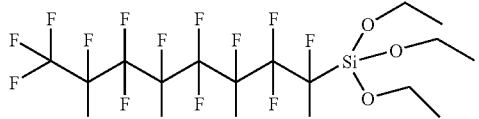

Perfluorooctyltriethoxysilane

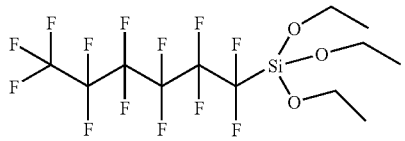

Perfluorohexanetriethoxysilane

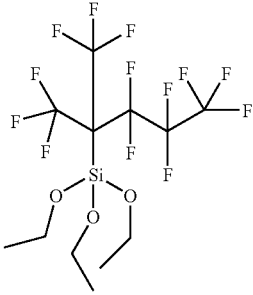

2-trifluoromethyl-2-triethoxysilyl perfluoro pentane

Precursors for the above compositions are available from, Gelest, Inc., Tullytown, Pa., Sigma-Aldrich, Stockholm, Sweden and ABCR Gmbh & Co., Karlsruhe, Germany. It will be appreciated that precursors for the compositions listed below are also commercially available from these sources.

Compound Example II

In yet another compound example, a compound is provided of the general formula: $R^1MOR^3{}_2X$, where $R^1$ is any partially or fully fluorinated organic group (preferably a partially or fully fluorinated aryl, alkenyl, alkynyl or alkyl group) as set forth above, where M is an element selected from group 14 of the periodic table as mentioned above, where X is a halogen, and where $OR^3$ is an alkoxy group as above. X in this example is preferably F, Cl, Br or I, and more preferably Cl or Br. Specific examples of compounds within this category include

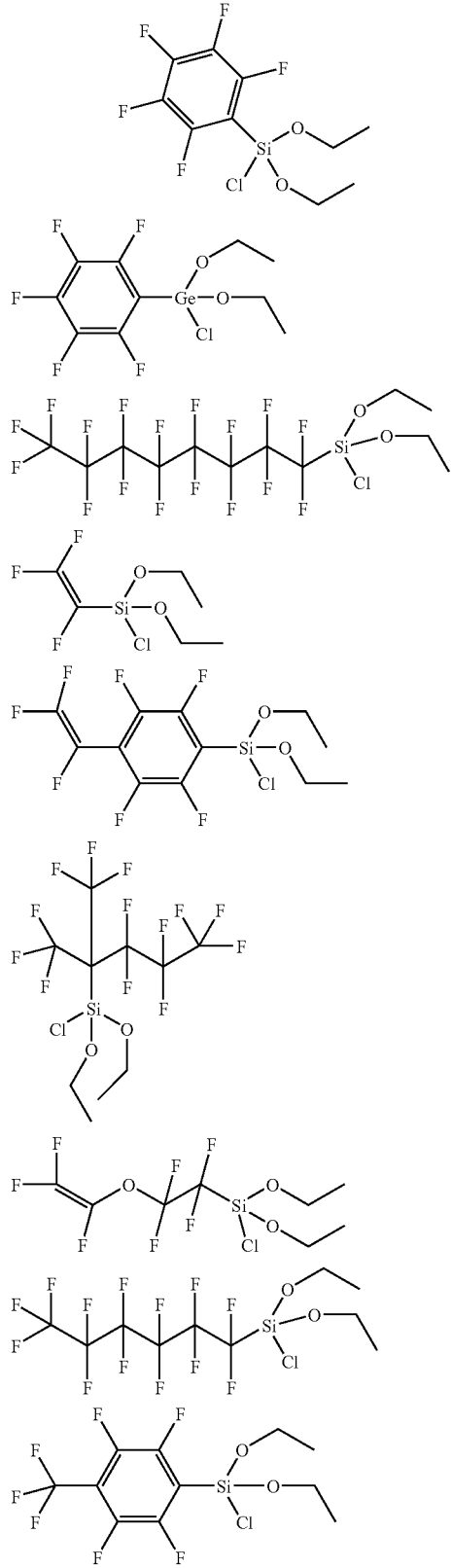

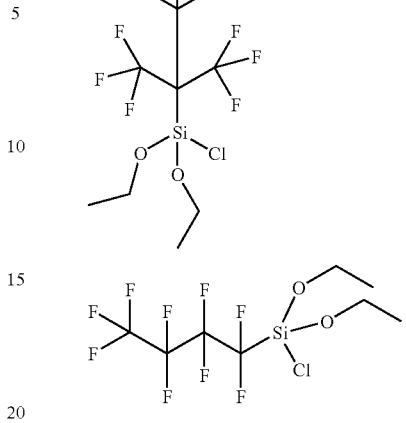

Compound Example III

In another compound example, a compound is provided of the general formula: $R^1MX_2OR^3$, where $R^1$ is any partially or fully fluorinated organic group (preferably a partially or fully fluorinated aryl, alkenyl, alkynyl or alkyl group) as set forth above, where M is an element selected from group 14 of the periodic table as mentioned above, where $OR^3$ is an alkoxy group as above, and where X is a halogen as above—M can be Si, $R^1$ can be perfluorinated phenyl, X can be Cl, and $OR^3$ can be ethoxy. Specific examples within this category include

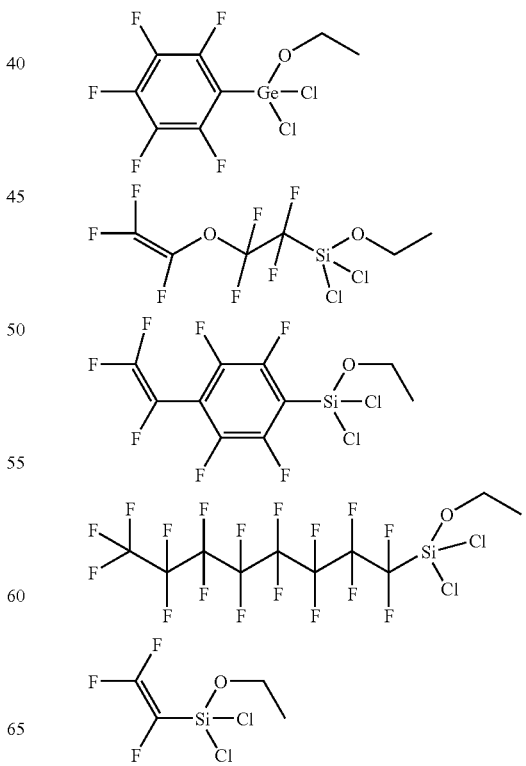

-continued

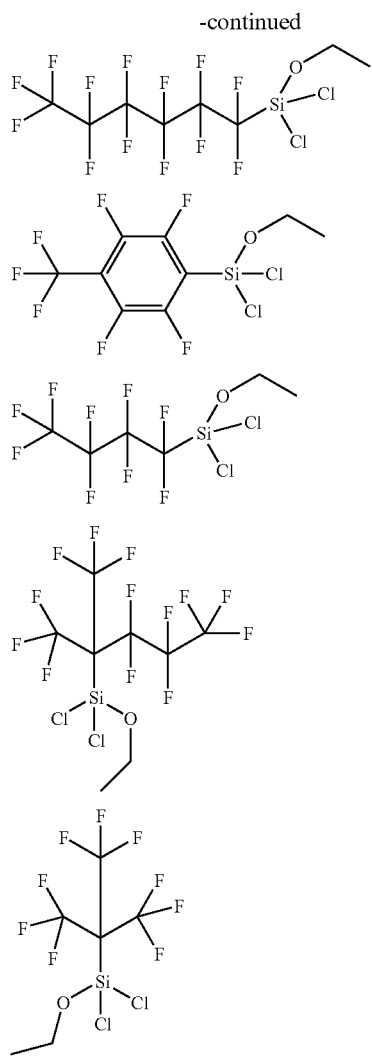

Compound Example IV

In a further compound example, a compound is provided of the general formula: $R^1MX_3$, where $R^1$ is any partially or fully fluorinated organic group (preferably a partially or fully fluorinated aryl, alkenyl, alkynyl or alkyl group) as set forth above, where M is an element selected from group 14 of the periodic table as mentioned above, and where X is a halogen as above—M can be Si, $R^1$ can be perfluorinated phenyl, perfluorinated methyl or perfluorinated vinyl, and X can be Cl. Specific examples within this category include:

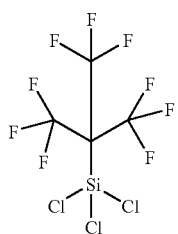

-continued

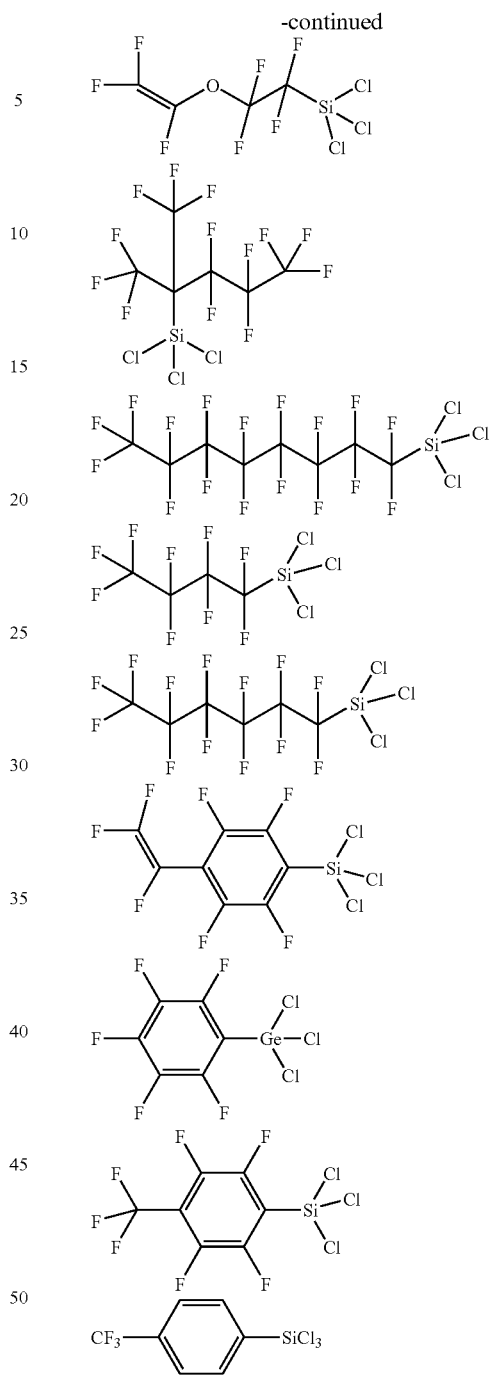

Compound Example V

In yet another compound example, a compound is provided of the general formula: $R^1R^2MOR^3{}_2$, where $R^1$ is any partially or fully fluorinated organic group (preferably a partially or fully fluorinated aryl, alkenyl, alkynyl or alkyl group) as set forth above with respect to $R^1$, $R^2$ is any partially or fully fluorinated organic group (preferably a partially or fully fluorinated aryl, alkenyl, alkynyl or alkyl group) as set forth above with respect to $R^1$, or any such organic groups nonfluorinated, and where $R^1$ and $R^2$ are the same or different from each other, where M is an element selected from group 14 of the periodic table as mentioned above, and where $OR^3$ is an alkoxy group as above. As an example, M can be Si, $OR^3$ can be ethoxy and $R^1$ and $R^2$ can be perfluorinated phenyl groups. Specific examples within this category include:

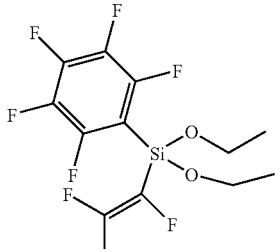

Pentafluorophenyltrifluorovinyldiethoxy-silane

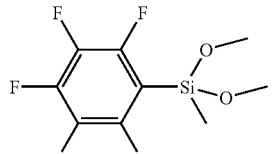

Methylpentafluorophenyldimethoxy-Silane

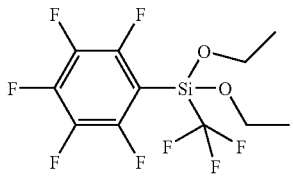

Pentafluorophenyltrifluoromethyl diethoxysilane

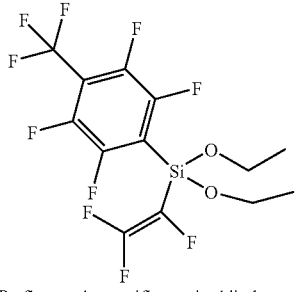

Perfluorotoluenetrifluorovinyldiethoxy-silane

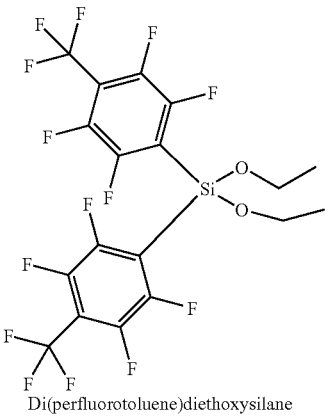

Di(perfluorotoluene)diethoxysilane

-continued

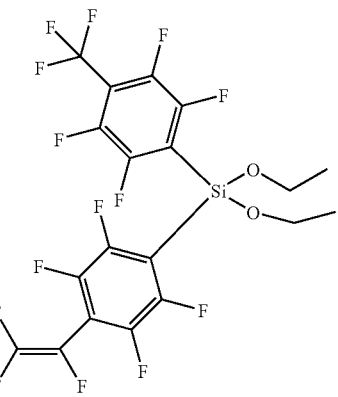

Perfluorostyreneperfluorotoluenediethoxy-Silane

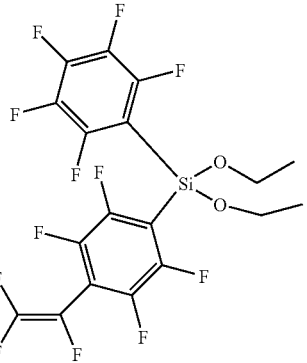

Pentafluorophenylperfluorostyryl-diethoxysilane

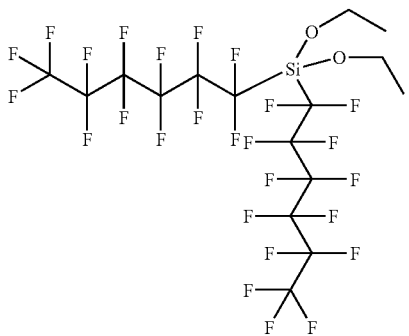

Bis(perfluorohexane)diethoxysilane

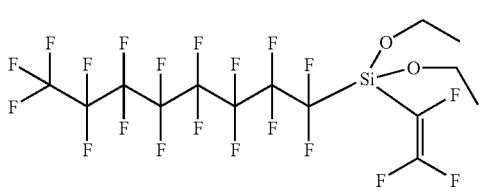

Perfluorooctyltrifluorovinyldiethoxysilane

-continued

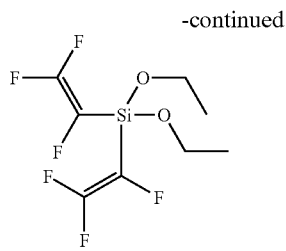

Bis(trifluorovinyl)diethoxysilane

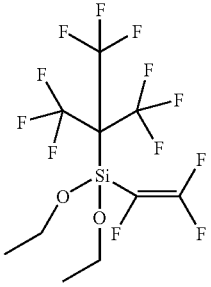

Perfluoro(t-butyl)trifluorovinyldiethoxysilane

Compound Example VI

In another compound example, a compound is provided of the general formula: $R^1R^2MXOR^3$, where $R^1$ is any partially or fully fluorinated organic group (preferably a partially or fully fluorinated aryl, alkenyl, alkynyl or alkyl group) as set forth above with respect to $R^1$, $R^2$ is any partially or fully fluorinated organic group (preferably a partially or fully fluorinated aryl, alkenyl, alkynyl or alkyl group) as set forth above with respect to $R^1$, or any such organic groups nonfluorinated, and where $R^1$ and $R^2$ are the same or different from each other, where M is an element selected from group 14 of the periodic table as mentioned above, where $OR^3$ is an alkoxy group as above, and where X is a halogen. $R^1$ and $R^2$ can be the same or different from each other. Specific examples within this category include:

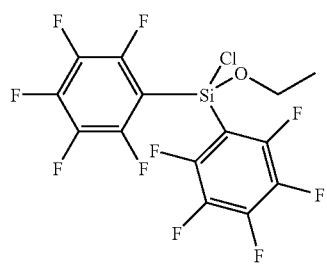

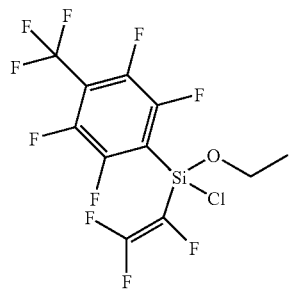

-continued

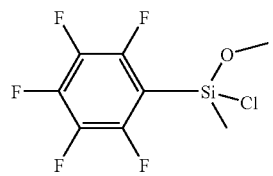

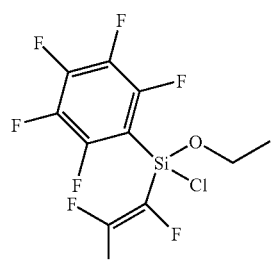

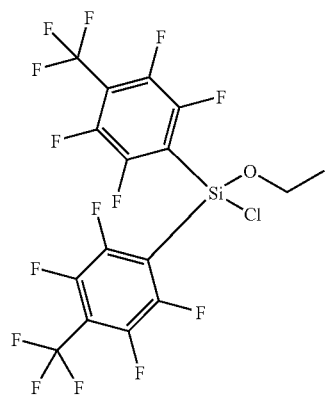

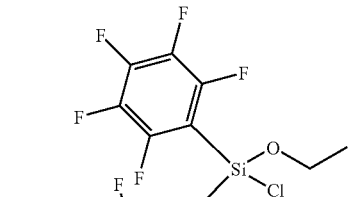

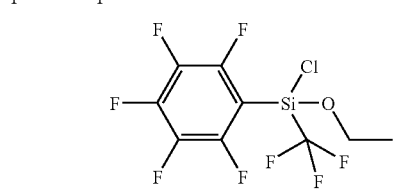

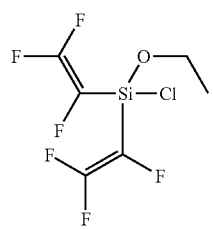

-continued

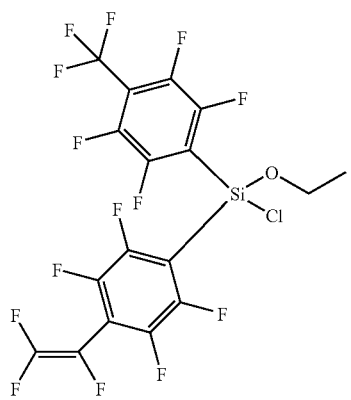

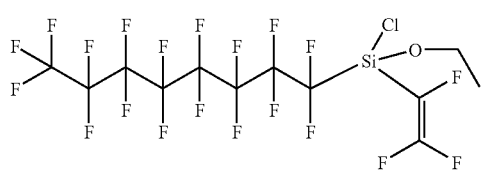

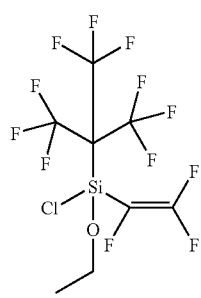

Compound Example VII

In a further compound example, a compound is provided of the general formula: $R^1R^2MX_2$, where $R^1$ is any partially or fully fluorinated organic group (preferably a partially or fully fluorinated aryl, alkenyl, alkynyl or alkyl group) as set forth above with respect to $R^1$, $R^2$ is any partially or fully fluorinated organic group (preferably a partially or fully fluorinated aryl, alkenyl, alkynyl or alkyl group) as set forth above with from each other, where M is an element selected from group 14 of the periodic table as mentioned above, and where X is a halogen as above—As an example, M can be Si, $R^1$ and $R^2$ can be perfluorinated phenyl, and X can be Cl. Specific examples within this category include:

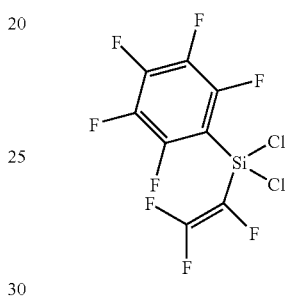

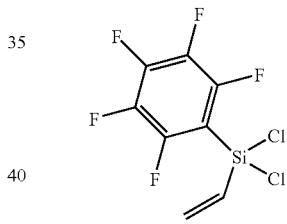

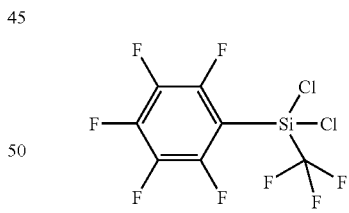

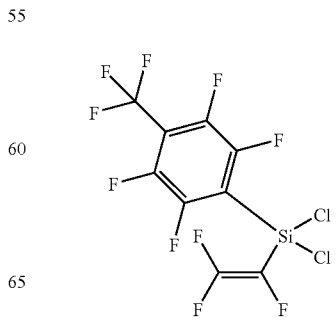

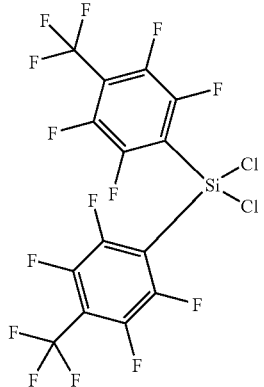

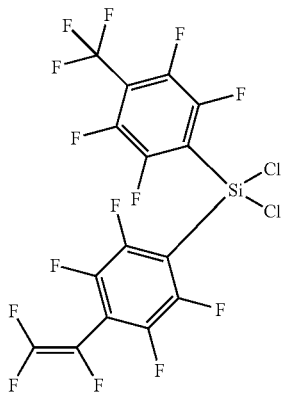

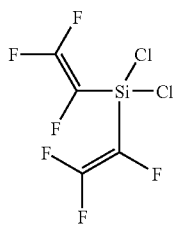

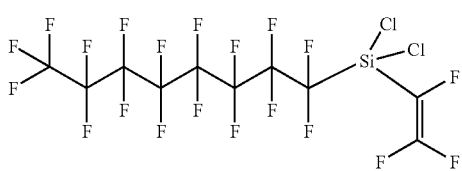

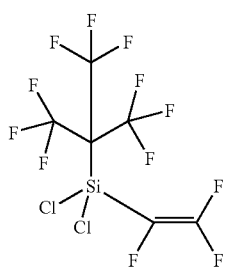

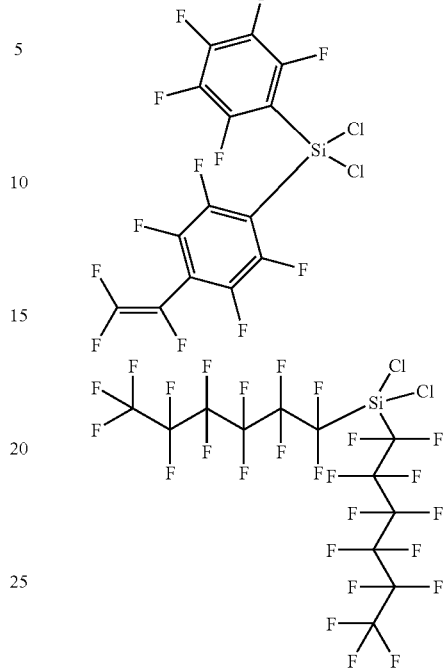

As Compounds V-VII have two organic groups, they can be formed by various combinations of Methods A, B and/or C (described in further detail below).

Compound VIII

In a further compound example, a compound is provided of the general formula: $R^1R^2R^3MOR^3$, where $R^1$, $R^2$ and $R^3$ are independently an aryl, alkenyl, alkynyl or alkyl group) as set forth above with respect to $R^1$ and $R^2$, and where $R^1$, $R^2$ and $R^3$ can each be the same or different from each other (and preferably at least one of where $R^1$, $R^2$ and $R^3$ is partially or fully fluorinated), where M is preferably an element selected from group 14 of the periodic table as above, and where $OR^3$ is an alkoxy group as above. One example is

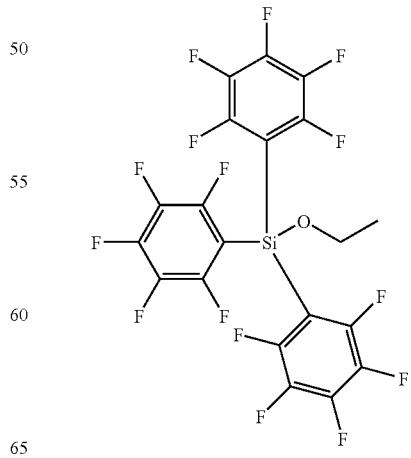

though the organic groups need not each be the same as in this example, and need not each be fluorinated (though preferably at least one of the organic groups is fluorinated).

Compound IX

In another compound example, a compound is provided of the general formula: $R^1R^2R^3MX$, where $R^1$, $R^2$ and $R^3$ are independently an aryl, alkenyl, alkynyl or alkyl group) as set forth above with respect to $R^1$ and $R^2$, and where $R^1$, $R^2$ and $R^3$ can each be the same or different from each other (and preferably at least one of where $R^1$, $R^2$ and $R^3$ is partially or fully fluorinated), where M is preferably an element selected from group 14 of the periodic table as above, and where X is a halogen as above. One example is:

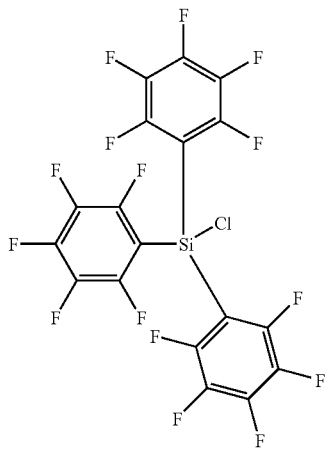

As Compounds VIII and IX have three organic groups, they can be formed by various combinations of Methods A, B and/or C (which methods are described in further detail below).

OTHER COMPOUNDS

Additional compounds for making the materials of the invention include those having the general formula $R^1MHX_2$ where $R^1$, M and X are as above and H is hydrogen. One example is:

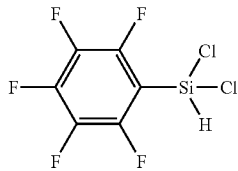

Other examples, where the fluorinated phenyl group is replaced with a substituted phenyl, fluorinated alkyl, vinyl, etc. are possible.

It should be noted that M in the compound formula examples above need not be tetravalent. M can also have other valencies, though preferably tri- or penta-valent. Examples would include early transition metals in group 3 or 5 of the periodic table (e.g., Y, V or Ta), or elements in columns 13 (column headed by B) or 15 (column headed by N), such as B, Al or As. In such situations, the compounds above would have one fewer or one additional alkoxy ($OR^3$), halogen (X) or an organic group ($R^1$ or $R^2$ independently from the other organic group(s)). Examples include $R^1MOR^3X$, $R^1MOR^3_2$, $R^1MX_2$, $R^1R^2MX$, $R^1R^2MOR^3$, where M is a trivalent early transition metal (or similar examples with five substituents selected from $R^1$ and/or $R^2$ groups, as well as alkoxy and halogens for pentavalent elements (including metalloids or transition metals). Such compounds could have the formula $R^1_{3-m}MOR^3_m$, $R^1_{5-m}MOR^3_m$, $R^2R^1_{4-m}MOR^3_m$ or $R^2R^1_{4-m}MOR^3_m$. If such tri- or penta-valent elements are used, such a compound would preferably be hydrolyzed and condensed as a dopant, rather than as the main portion of the material at the time of hydrolysis and condensation (likewise with non-silicon tetravalent elements that form compounds in accordance with the tetravalent examples above, such as germanium compounds).

It should also be noted that the structures illustrated above are exemplary only, as other ring structures (3 sided—e.g., epoxy, or 4 to 8 sided—preferably 5 or 6 sided) are possible, which structures can include nitrogen or oxygen in or bound the ring. The aryl group can have from 1 to 3 substituents, such as one or more methyl, ethyl, ally, vinyl or other substituents—that can be fluorinated or not. Also, carbon chain R groups can include oxygen (e.g., carboxylate) or nitrogen or sulfur. If an alkyl group is bound to the silicon (or other M group), it can have from 1 to 4 carbons (e.g., a C2+ straight or C3+ branched chain), or up to 14 carbons (or more)—if used as a bulk enhancing group for later hydrolysis and deposition, 4 or more carbons are preferable. These aryl groups can be fully or partially fluorinated, as can alkenyl or alkynyl groups if used.

METHODS OF MAKING THE COMPOUNDS

In a number of the following examples of methods for making the materials of the invention, "M" is silicon, $OR^3$ is ethoxy, and X is Cl. However, as noted above, other alkoxy groups could easily be used (methoxy, propoxy, etc.), and other group 3-5 or 13-16 elements could be used in place of silicon and other halogens in place of chlorine. Starting materials can vary from tetraethoxy silane, to ethoxy silanes having one or more organic groups bound to the silicon, to chorosilanes having one or more chlorine groups and/or one or more organic groups, as well as starting materials having chlorine and alkoxy groups and with one or more organic groups. Any compound examples within Compounds I-IX above could be used as starting materials—or could be intermediate or final compounds as will be seen below. For example, trifluorovinyltriethoxysilane could be a final compound resulting from reacting a particular trifluorovinyl compound with tetraethoxysilane, or trifluorovinylsilane could be a starting material that, when reacted with a particular pentafluorophenyl compound, results in pentafluorophenyltrifluorovinyldiethoxysilane. As mentioned above, it is also preferred that any organic groups that are part of the starting material or are "added" by chemical reaction to become part of the compound as set forth below, are partially or fully fluorinated (or fully or partially deuterated), though such is not necessary as will also be seen below.

One example of a method for making the materials of the present invention comprises providing a compound $R^1_{4-q}MOR^3_q$ where M is selected from group 14 of the periodic table, $OR^3$ is an alkoxy group, $R^1$ is an alkyl, alkenyl, aryl or alkynyl, and q is from 2 to 4; reacting the compound $R^1_{4-q}MOR^3_q$ with either a) Mg and $R^2X^2$ where $X^2$ is Cl, Br or I and $R^2$ is an alkyl, alkenyl, aryl or alkynyl group, or b) reacting with $R^2X^1$ where $R^2$ is an alkyl, alkenyl, aryl or alkynyl group and wherein $R^2$ is fully or partially fluorinated or deuterated and $X^1$ is an element from group 1 of the periodic table; so as to replace one of the $OR^3$ groups in $R^1_{4-q}MOR^3_q$ so as to form $R^1_{4-q}R^2MOR^3_{q-1}$.

The starting material preferably has 1 or 2 (or no) organic groups ($R^1$) bound to the group 14 element "M", which organic groups may or may not comprise fluorine, with the remaining groups bound to M being alkoxy groups. An additional preferably fluorinated (partially of fully) organic group becomes bound to the group 14 element by one of a number of reactions. One method (Method A) involves reacting the starting material with magnesium and a compound having the desired organic group ($R^2$) bound to a halogen $X^2$ (preferably Cl, Br or I)—namely $R^2X^2$, which reaction replaces one of the alkoxy groups with the organic group $R^2$. In the above example, a single alkoxy group is replaced, however, depending upon the molar ratios of starting material to $R^2X^2$ and Mg, more than one alkoxy group can be replaced with an $R^2$ organic group. In one example of the above, a tetraethoxysilane, $MOR^3_4$ is reacted with a compound $R^2X^2$ where $R^2$ is a preferably fluorinated alkyl, aryl, alkenyl or alkynyl group and $X^2$ is preferably Br or I, so as to form $R^2MOR^3_3$. In another example, $R^1MOR^3_3$ is reacted with $R^2X^2$ so as to form $R^1R^2MOR^3_2$. This group of reactions can be referred to as: reacting the starting material $R^1_{4-q}MOR^3_q$ with $R^2X^2$ where $R^2$ is a preferably fluorinated alkyl, aryl, alkenyl or alkynyl group and $X^2$ is preferably Br or I, so as to form $R^1_{4-q}R^2MOR^3_{q-1}$.

This method A can be described as a method comprising reacting a compound of the general formula $R^1_{4-m}MOR^3_m$, wherein m is an integer from 2 to 4, $OR^3$ is an alkoxy, and M is an element selected from group 14 of the periodic table; with a compound of the general formula $R^2X^2$+Mg, wherein $X^2$ is Br or I, where $R^1$ and $R^2$ are independently selected from alkyl, alkenyl, aryl or alkynyl, and wherein at least one of $R^1$ and $R^2$ is partially or fully fluorinated, so as to make a compound of the general formula $R^2MR^1_{3-n}OR^3_n$, wherein n is an integer from 1 to 3.

An alternate to the above method (Method B) is to react the same starting materials ($R^1_{4-q}MOR^3_q$) with a compound $R^2X^1$ where, as above, $R^2$ is an alkyl, alkenyl, aryl or alkynyl group and wherein $R^2$ is fully or partially fluorinated or deuterated and $X^1$ is an element from group 1 of the periodic table; so as to replace an $OR^3$ group in $R^1_{4-q}MOR^3_q$ to form $R^1_{4-q}R^2MOR^3_{q-1}$. In this example, $X^1$ is an element group 1 of the periodic table, and is preferably Na, Li or K (more preferably Na or Li). In one example of the above, a tetraethoxysilane, $MOR^3_4$ is reacted with a compound $R^2X^1$ where $R^2$ is a preferably fluorinated alkyl, aryl, alkenyl or alkynyl group and $X^1$ is preferably an element from group I of the periodic table, so as to form $R^2MOR^3_3$. In another example, $R^1MOR^3_3$ is reacted with $R^2X^1$ so as to form $R^1R^2MOR^3_2$.

This method B can be described as a method comprising reacting a compound of the general formula $R^1_{4-m}MOR^3_m$ wherein m is an integer from 2 to 4, $R^1$ is selected from alkyl, alkenyl, aryl, or alkyl, alkenyl or aryl, and wherein $R^1$ is nonfluorinated, or fully or partially fluorinated, $OR^3$ is alkoxy, and M is an element selected from group 14 of the periodic table; with a compound of the general formula $R^2M1$, wherein $R^2$ is selected from alkyl, alkenyl, aryl, alkynyl, and wherein $R^2$ is at least partially fluorinated; and M1 is an element from group I of the periodic table; so as to make a compound of the general formula $R^1_{4-m}MOR^3_{m-1}R^2$.

A modification (Method C) of the aforementioned (Method B), is to react the starting material ($R^1_{4-q}MOR^3_q$) with a halogen or halogen compound so as to replace one or more of the $OR^3$ groups with a halogen due to reaction with the halogen or halogen compound. The halogen or halogen compound can be any suitable material such as hydrobromic acid, thionylbromide, hydrochloric acid, chlorine, bromine, thionylchloride or sulfurylchloride and the like. Depending upon the ratio of halogen or halogen compound to starting material (and other parameters such as reaction time and/or temperature), one or more alkoxy groups can be replaced by a halogen—though in most examples, a single alkoxy group or all alkoxy groups will be replaced. If a single alkoxy group is replaced, then the starting material $R^1_{4-q}MOR^3_q$ becomes $R^1_{4-q}MOR^3_{q-1}X^3$ where $X^3$ is a halogen from the halogen or halogen compound reacted with the starting material (or simply begin with starting material $R^1_{4-q}MOR^3_{q-1}X^3$). If all alkoxy groups are replaced due to the reaction with the halogen or halogen compound, then the starting material $R^1_{4-q}MOR^3_q$ becomes $R^1_{4-q}MX^3_q$. Then, as mentioned for Method B above, either starting material $R^1_{4-q}MOR^3_{q-1}X^3$ or $R^1_{4-q}MX^3_q$ is reacted with compound $R^2X^1$ where $R^2$ is a preferably fluorinated alkyl, aryl, alkenyl or alkynyl group and $X^1$ is preferably an element from group I of the periodic table, so as to form $R^1_{4-q}R^2MOR^3_{q-1}$, $R^1_{4-q}R^2MX^3_{q-1}$ (or even $R^1_{4-q}R^2_2MX^3_{q-2}$ depending upon reaction conditions). A reaction with $R^1_{4-q}MOR^3_{q-1}X^3$ is preferred due to greater ease of control of the reaction.

This Method C can be described as a method comprising reacting a compound of the general formula $X^3MOR^3_3$, where $X^3$ is a halogen, M is an element selected from group 14 of the periodic table, and $OR^3$ is alkoxy; with a compound of the general formula $R^1M1$; where $R^1$ is selected from alkyl, alkenyl, aryl and alkynyl and wherein $R^1$ is partially or fully fluorinated; and M1 is an element from group I of the periodic table; so as to form a compound of the general formula $R^1MOR3_3$.

Related Methods B and C can be described as a single method comprising reacting a compound of the general formula $R^1_{4-m}MOR^3_{m-n}X_n$ wherein m is an integer from 2 to 4, and n is an integer from 0 to 2, $R^1$ is selected from alkyl, alkenyl, aryl, or alkyl, alkenyl or aryl, and wherein $R^1$ is nonfluorinated, or fully or partially fluorinated; $OR^3$ is alkoxy, and M is an element selected from group 14 of the periodic table; with a compound of the general formula $R^2M1$, wherein $R^2$ is selected from alkyl, alkenyl, aryl, alkynyl, and wherein $R^2$ is at least partially fluorinated, and M1 is an element from group I of the periodic table; so as to make a compound of the general formula $R^2MR^1_{4-m}OR^3_{m-n}X_{n-1}$.

Of course, as will be seen below, the above starting materials in the method examples set forth above are only examples, as many other starting materials could be used. For example, the starting material could be a halide rather than an alkoxide (e.g., a mono-, di- or trichlorosilanes) or another material having both alkoxy and halogens on the group 14 element, along with 0, 1 or even 2 organic groups (alkyl, alkenyl, aryl, alkynyl) also bound to the group 14 element. Though the methods for making the materials of the invention preferably use starting materials having the group 14 element set forth above, many different combinations of alkoxy groups, halogens, and organic groups (alkyl, alkenyl, etc.) can be bound to the group 14 element. And, of course, such starting materials can be commercially available starting materials or can be made from other available starting materials (in which case such materials are intermediate compounds in the methods for making the materials of the invention).

In addition, the methods for making the materials of the invention include, a method for forming a final compound could include Methods A, B and/or C above. For example, one organic group, preferably fluorinated, could become bound to the group 14 element M by Method A followed by binding a second organic group, preferably fluorinated, to the group 14 element M by Method B. Or, Method B could be performed first, followed by Method A—or Method C could be performed in combination with Methods A and/or B, etc. And, of course, any particular reaction (binding of an organic group to M) could be performed only once by a particular reaction, or multiple times (binding of multiple organic groups, the same or different from each other) by repeating the same reaction (a, b or c) multiple times. Many combinations of these various reactions and starting materials are possible. Furthermore, any of the methods or method combinations could include any of a number of additional steps including preparation of the starting material, replacing one or more alkoxy groups of the final compound with halogens, purifying the final compound, casting the compund from a solvent as a precursor or hydrolysis and condensation of the final compound (as will be described further below), etc.

EXAMPLE 1 (MAKING A COMPOUND I VIA METHOD B)

$CF_2=CF-Cl+sec/tert-BuLi \rightarrow CF_2=CF-Li+BuCl$

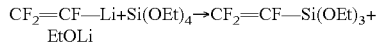

$CF_2=CF-Li+Si(OEt)_4 \rightarrow CF_2=CF-Si(OEt)_3+$ EtOLi 200 ml of freshly distilled dry $Et_2O$ is added to a 500 ml vessel (under an argon atmosphere). The vessel is cooled down to −80° C. and 15 g (0.129 mol) of $CF_2=CFCl$ gas is bubbled to $Et_2O$. 100 ml (0.13 mol) of sec-BuLi is added dropwise during three hours. The temperature of the solution is kept below −60° C. all the time. The solution is stirred for 15 minutes and 29 ml (27.08 g, 0.130 mol) of $Si(OEt)_4$ is added in small portions. The solution is stirred for over night allowing it to warm up to room temperature. Formed red solution is filtered and evaporated to dryness to result crude trifluorovinyltriethoxysilane, $CF_2=CFSi(OEt)_3$.

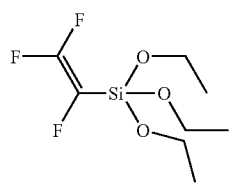

EXAMPLE 2 (MAKING A COMPOUND I VIA METHOD C)

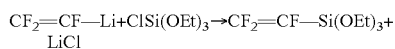

$CF_2=CF-Li+ClSi(OEt)_3 \rightarrow CF_2=CF-Si(OEt)_3+$ LiCl $CF_2=CFSi(OEt)_3$ is also formed when 30.80 g (0.155 mol) $ClSi(OEt)_3$ in $Et_2O$ is slowly added to solution of $CF_2=CF-Li$ (0.155 mol, 13.633 g, prepared in situ) in $Et_2O$ at −78° C. Reaction mixture is stirred overnight allowing it slowly warm to room temperature. LiCl is removed by filtration and solution evaporated to dryness to result yellow liquid, crude trifluorovinyltriethoxysilane.

EXAMPLE 3 (MAKING A COMPOUND IV VIA METHOD B OR C)

Follow steps in Example 1 or 2 above, followed by

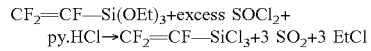

$CF_2=CF-Si(OEt)_3+excess\ SOCl_2+$ $py.HCl \rightarrow CF_2=CF-SiCl_3+3\ SO_2+3\ EtCl$ 24.4 g (0.100 mol) crude trifluorovinyltriethoxysilane, 44 mL (0.60 mol, 71.4 g) thionylchloride and 1.1 g (0.0045 mol) pyridinium hydrochloride are refluxed and stirred for 24 h. Excess of $SOCl_2$ is evaporated and trifluorovinyltrichlorosilane

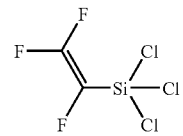

is purified by distillation.

EXAMPLE 4 (MAKING A COMPOUND I VIA METHOD A)

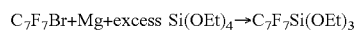

$C_7F_7Br+Mg+excess\ Si(OEt)_4 \rightarrow C_7F_7Si(OEt)_3$ 250 g (0.8418 mol) heptafluorobromotoluene, 22.69 g (0.933 mol) magnesium powder, small amount of iodine (15 crystals) and 750 mL (3.3672 mol, 701.49 g) tetraethoxysilane are mixed together at room temperature and diethylether is added dropwise to the vigorously stirred solution until an exothermic reaction is observed (~250 mL). After stirring at room temperature for 16 h diethylether is evaporated. An excess of n-heptane (~600 mL) is added to precipitate the magnesium salts. Solution is filtrated and evaporated to dryness. The residue is fractionally distilled under reduced pressure to yield heptafluorotoluene-triethoxysilane.

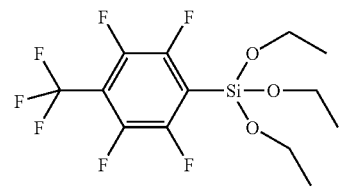

EXAMPLE 5 (MAKING A COMPOUND IV VIA METHOD A)

Follow the steps in Example 4, followed by $C_7F_7Si(OEt)_3+6$ $SOCl_2+py.HCl \rightarrow C_7F_7SiCl_3 2$ where 114.1 g (0.300 mol) heptafluorotoluenetriethoxysilane, 131 mL (1.800 mol, 214.1 g) thionylchloride and 4.51 g (0.039 mol) pyridinium hydrochloride are refluxed and stirred for 16 h. Excess of $SOCl_2$ is evaporated and perfluorotoluenetrichlorosilane

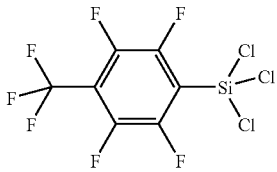

isolated by vacuum-distillation.

EXAMPLE 6 (MAKING A COMPOUND III VIA METHOD A)

Follow same steps as in Example 5, except isolate (by vacuum distillation at the end), perfluorotoluenedichloroethoxysilane, $CF_3$—$C_6F_4$—$Si(OEt)Cl_2$

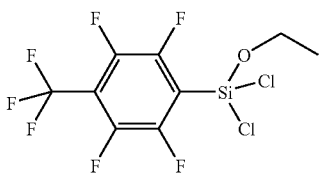

EXAMPLE 7 (MAKING A COMPOUND V FROM A COMPOUND I OR II VIA METHOD C)

$C_6F_5Si(OEt)_3 + SOCl_2 + py.HCl \rightarrow C_6F_5Si(OEt)_2Cl + EtCl$  (1)

$C_6F_5Si(OEt)_2Cl + CF_2=CFLi \rightarrow C_6F_5(CF_2=CF)Si(OEt)_2$  (2)

$C_6F_5(CF_2=CF)Si(OEt)_2 + \text{excess } SOCl_2 + py.HCl \rightarrow C_6F_5(CF_2=CF)SiCl_2$  (3)

152.0 g (0.460 mol) pentafluorophenyltriethoxysilane, 34 mL (0.460 mol, 54.724 g) thionylchloride and 6.910 g (0.0598 mol) pyridinium hydrochloride are refluxed and stirred for 18 h. Pyridinium hydrochloride is precipitated at −78° C. and the solution is filtrated. Pentafluorophenylchlorodiethoxysilane

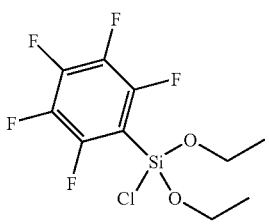

is isolated by vacuum distillation.

Then 49.712 g (0.155 mol) pentafluorophenylchlorodiethoxysilane, $C_6F_5SiCl(OEt)_2$, in $Et_2O$ is slowly added to solution of $CF_2=CF$—Li (0.155 mol, 13.633 g, prepared in situ) in $Et_2O$ at −78° C. Reaction mixture is stirred overnight while it will slowly warm to room temperature. LiCl is removed by filtration and the product, pentafluorophenyl-trifluorovinyldiethoxysilane,

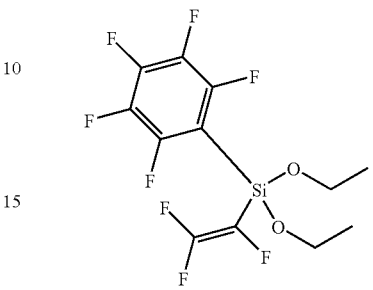

purified by distillation.

EXAMPLE 8 (MAKING A COMPOUND VII FROM A COMPOUND I OR II VIA METHOD C)

Follow the steps above for Example 7, and then 12.1 g (0.0328 mol) pentafluorophenyltrifluorovinyldiethoxysilane, 12 mL (0.1638 mol, 19.487 g) thionylchloride and 0.50 g (0.0043 mol) pyridinium hydrochloride are refluxed and stirred for 24 h. Excess of $SOCl_2$ is evaporated and residue is fractionally distilled under reduced pressure to yield a mixture of 80% pentafluorophenyltrifluorovinyldichlorosilane.

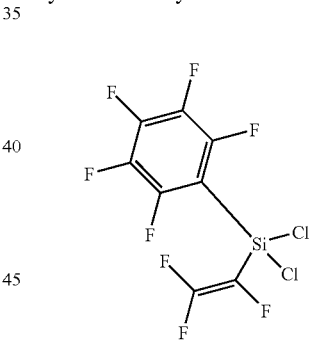

EXAMPLE 9 (MAKING A COMPOUND I VIA METHOD A)

$C_6F_5Br + Mg + 2\ Ge(OEt)_4 \rightarrow C_6F_5Ge(OEt)_3$ 61.5 mL (0.4944 mol, 122.095 g) pentafluorobromobenzene, 13.22 g (0.5438 mol) magnesium powder and 250.00 g (0.9888 mol) tetraethoxygermane are mixed together at room temperature and diethylether is added dropwise to the vigorously stirred solution until an exothermic reaction is observed (~400 mL). After stirring at 35° C. for 16 h the mixture is cooled to room temperature and diethylether evaporated. An excess of n-heptane (~400 mL) is added to precipitate the magnesium salts. Solution is filtrated and evaporated to dryness. The residue is fractionally distilled under reduced pressure to yield pentafluorophenyl-triethoxygermane.

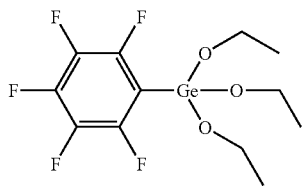

EXAMPLE 10 (MAKING A COMPOUND IV VIA METHOD A)

Follow the steps in Example 9, then:

50 g (0.133 mol) pentafluorophenyltriethoxygermane, 58 mL (0.80 mol, 95.2 g) thionylchloride and 1.97 g (0.017 mol) pyridinium hydrochloride are refluxed and stirred for 24 h. Excess of SOCl$_2$ is evaporated and pentafluorophenyltrichlorogermane isolated by vacuum distillation.

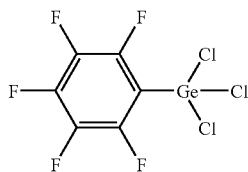

EXAMPLE 11 (MAKING A COMPOUND I VIA METHOD A)

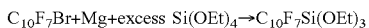

166.5 g (0.50 mol) 2-bromoperfluoronaphthalene, 13.37 g (0.55 mol) magnesium powder and 448.0 mL (2.00 mol, 416.659 g) tetraethoxysilane are mixed together at room temperature and diethylether is added dropwise to the vigorously stirred solution until an exothermic reaction is observed (~200 mL). After stirring at 35° C. for 16 h the mixture is cooled to room temperature and diethylether evaporated. An excess of n-heptane (~400 mL) is added to precipitate the magnesium salts. Solution is filtrated and evaporated to dryness. The residue is fractionally distilled under reduced pressure to yield perfluoronaphthalenetriethoxysilane.

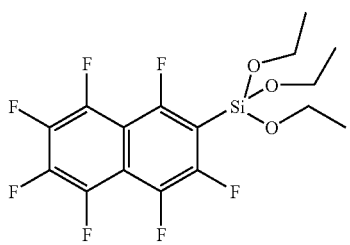

EXAMPLE 12 (MAKING A COMPOUND IV VIA METHOD A)

Follow the steps in Example 11, then 100 g (0.240 mol) perfluoronaphthalenetriethoxysilane, 105.2 mL (1.442 mol, 171.55 g) thionylchloride and 3.54 g (0.0306 mol) pyridinium hydrochloride are refluxed and stirred for 24 h. Excess of SOCl$_2$ is evaporated and perfluoronaphthalenetrichlorosilane isolated by vacuum distillation.

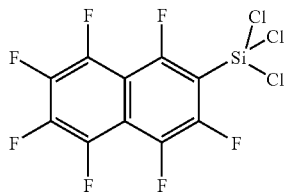

EXAMPLE 13 (MAKING COMPOUND V VIA METHOD A)

C$_6$F$_5$Br+Mg+4 MeSi(OMe)$_3$→C$_6$F$_5$(Me)Si(OMe)$_2$ 57.9 mL (0.465 mol, 114.726 g) bromopentafluorobenzene, 12.42 g (0.511 mol) magnesium powder and 265 mL (1.858 mol, 253.128 g) methyltrimethoxysilane are mixed together at room temperature and diethylether is added dropwise to the vigorously stirred solution until an exothermic reaction is observed (~320 mL). After stirring at 45° C. for 16 h the mixture is cooled to room temperature and diethylether evaporated. An excess of n-heptane (~300 mL) is added to precipitate the magnesium salts. Solution is filtrated and evaporated to dryness. The residue, methyl (pentafluorophenyl)-dimethoxysilane, is used without further purification.

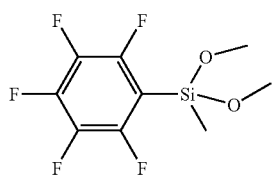

EXAMPLE 14 (MAKING COMPOUND VII VIA METHOD A)

Follow steps in Example 13, then 81.68 g (0.300 mol) methyl(pentafluorophenyl)dimethoxysilane, 109 mL (1.50 mol, 178.4 g) thionylchloride and 3.69 g (0.0319 mol) pyridinium hydrochloride are refluxed and stirred for 16 h. Excess of SOCl$_2$ is evaporated and methyl(pentafluorophenyl)dichlorosilane isolated by vacuum-distillation.

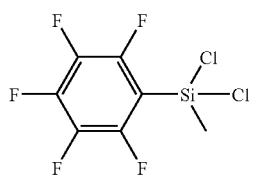

EXAMPLE 15 (MAKING A COMPOUND V VIA METHOD A)

265.2 mL (1.95 mol, 525.353 g) bromopentafluorobenzene, 52.11 g (2.144 mol) magnesium powder and 216 mL (0.975 mol, 203.025 g) tetraethoxysilane are mixed together at room temperature and diethylether is added dropwise to the vigorously stirred solution until an exothermic reaction is observed (~240 mL). The solution is stirred for 30 minutes after which additional 90 mL of $Et_2O$ is carefully added. After stirring at 35° C. for 16 h the mixture is cooled to room temperature and diethylether evaporated. An excess of n-heptane (~600 mL) is added to precipitate the magnesium salts. Solution is filtrated and evaporated to dryness. The residue is fractionally distilled under reduced pressure to yield di(pentafluorophenyl)diethoxysilane.

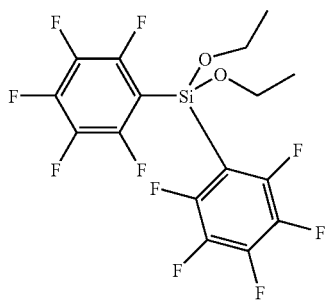

EXAMPLE 16 (MAKING A COMPOUND V VIA METHOD C)

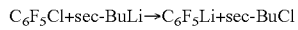

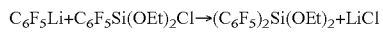

39.52 g (0.195 mol) chloropentafluorobenzene is weighed to a 1000 mL vessel and 250 mL $Et_2O$ is added. The vessel is cooled down to −70° C. and 150 mL (0.195 mol) of sec-BuLi (1.3 M) is added dropwise during one hour. The temperature of the solution is kept below −50° C. all the time. The solution is stirred for 30 minutes and 62.54 g (0.195 mol) of diethoxychloropentafluorophenylsilane in $Et_2O$ (100 mL) is added in small portions. The solution is stirred for over night allowing it to warm up to room temperature. Formed clear solution is filtered and evaporated to dryness to result di(pentafluorophenyl)diethoxysilane, $(C_6F_5)_2Si(OEt)_2$.

EXAMPLE 17 (MAKING A COMPOUND VII VIA METHOD A OR C)

Follow the steps in Example 15 or Example 16, then:

180.93 g (0.400 mol) di(pentafluorophenyl)diethoxysilane, 146 mL (2.00 mol, 237.9 g) thionylchloride and 4.92 g (0.0426 mol) pyridinium hydrochloride are refluxed and stirred for 16 h. Excess of $SOCl_2$ is evaporated and di(pentafluorophenyl)dichlorosilane isolated by vacuum-distillation.

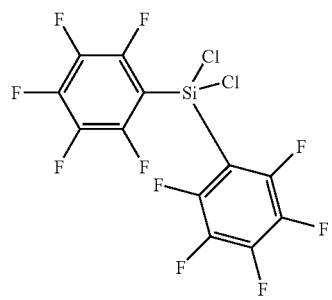

EXAMPLE 18 (MAKING AN "OTHER COMPOUND" VIA METHOD A)

$C_6F_5MgBr+HSiCl_3 \rightarrow C_6F_5(H)SiCl_2$ 600.0 mL (0.300 mol) pentafluorophenyl magnesiumbromide (0.5 M sol. in $Et_2O$) is added dropwise to a solution of 30.3 mL (0.300 mol, 40.635 g) $HSiCl_3$ in $Et_2O$ at −70° C. Reaction mixture is allowed to warm slowly to room temperature by stirring overnight. Diethylether is evaporated and an excess of n-heptane (~200 mL) is added to precipitate the magnesium salts. Solution is filtrated and evaporated to dryness. The residue, pentafluorophenyldichlorosilane, is purified by fractional distillation.

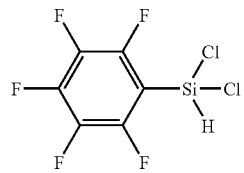

EXAMPLE 19 (MAKING A COMPOUND I VIA METHOD C)

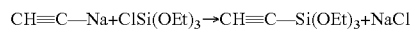

79.49 g (0.400 mol) $ClSi(OEt)_3$ in $Et_2O$ is slowly added to a slurry of CH≡C—Na (0.400 mol, 19.208 g) in Xylene/light mineral oil at −78° C. Reaction mixture is stirred overnight allowing it slowly warm to room temperature. NaCl is removed by filtration and solution evaporated to dryness to result acetylenetriethoxysilane.

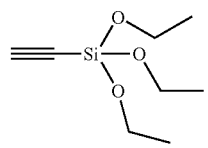

EXAMPLE 20 (MAKING A COMPOUND VII VIA METHOD A)

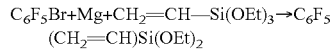

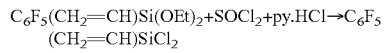

100 mL (0.8021 mol, 198.088 g) pentafluorobromobenzene, 24.90 g (1.024 mol) magnesium powder and 670 mL (3.2084 mol, 610.623 g) vinyltriethoxysilane are mixed together at room temperature and Et$_2$O is added dropwise to the vigorously stirred solution until an exothermic reaction is observed (~400 mL). After stirring at 35° C. for 16 h the mixture is cooled to room temperature and diethylether evaporated. An excess of n-heptane (~500 mL) is added to precipitate the magnesium salts. Solution is filtrated and evaporated to dryness. The residue is fractionally distilled under reduced pressure to yield pentafluorophenylvinyldiethoxysilane.

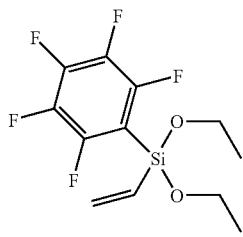

120.275 g (0.3914 mol) pentafluorophenylvinyldiethoxysilane, 143 mL (1.9571 mol, 232.833 g) thionylchloride and 5.880 g (0.0509 mol) pyridinium hydrochloride are refluxed and stirred for 24 h. Excess of SOCl$_2$ is evaporated and pentafluorophenylvinyldichlorosilane

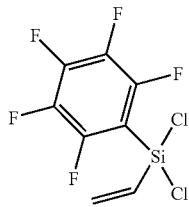

isolated by vacuum distillation.

EXAMPLE 21 (MAKING A COMPOUND I FROM METHOD B)

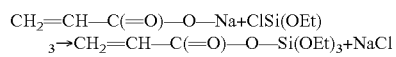

6.123 g (0.0651 mol) sodium acrylate is dissolved to 25 mL THF and cooled to −70° C. 12.8 mL (0.0651 mol, 12.938 g) chlorotriethoxysilane in THF (15 mL) is added dropwise to reaction solution. The solution is stirred for over night allowing it to warm up to room temperature. NaCl is removed by filtration and solution evaporated to dryness to result clear liquid, acryltriethoxysilane.

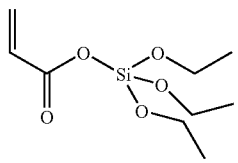

EXAMPLE 22 (MAKING A COMPOUND II)

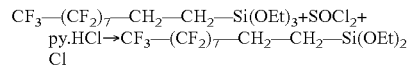

183.11 g (0.300 mol) 1H,1H,2H,2H-Perfluorodecyltriethoxysilane, 22 mL (0.300 mol, 35.69 g) thionylchloride and 4.51 g (0.039 mol) pyridinium hydrochloride are refluxed and stirred for 16 h. Excess of SOCl$_2$ is evaporated and 1H,1H,2H,2H-Perfluorodecylchlorodi(ethoxy)silane isolated by vacuum-distillation.

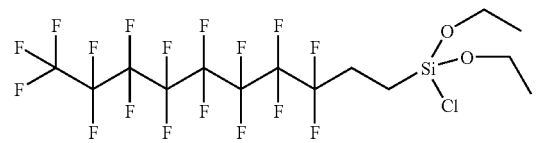

Though this example is not using Methods A, B or C, method C could be used to add a second organic group (replacing the Cl group), or Methods A and B could be used replace an ethoxy group in the starting material with an additional organic group. Also, the starting material could be made by Methods A, B or C (starting earlier with a tetraethoxysilane and reacting as in the other examples herein).

EXAMPLE 23 (MAKING A COMPOUND I VIA METHOD A)

C$_8$F$_{17}$Br+Mg+excess Si(OEt)$_4$→C$_8$F$_{17}$Si(OEt)$_3$

C$_8$F$_{17}$Si(OEt)$_3$+excess SOCl$_2$+py.HCl→C$_8$F$_{17}$SiCl$_3$ 250 g (0.501 mol) 1-Bromoperfluorooctane (or 273.5 g, 0.501 mol 1-Iodoperfluorooctane), 13.39 g (0.551 mol) magnesium powder, small amount of iodine (15 crystals) and 363 mL (2.004 mol, 339.00 g) tetraethoxysilane are mixed together at room temperature and diethylether is added dropwise to the vigorously stirred solution until an exothermic reaction is observed (~200 mL). After stirring at room temperature for 16 h diethylether is evaporated. An excess of n-heptane (~400 mL) is added to precipitate the magnesium salts. Solution is filtrated and evaporated to dryness. The residue is fractionally distilled under reduced pressure to yield perfluorooctyltriethoxysilane.

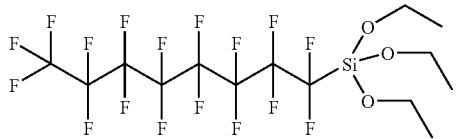

EXAMPLE 24 (MAKING A COMPOUND IV VIA METHOD A)

Follow the steps in Example 23, then 174.7 g (0.300 mol) perfluorooctyltriethoxysilane, 131 mL (1.800 mol, 214.1 g) thionylchloride and 4.51 g (0.039 mol) pyridinium hydrochloride are refluxed and stirred for 16 h. Excess of $SOCl_2$ is evaporated and perfluorooctyltrichlorosilane isolated by vacuum-distillation.

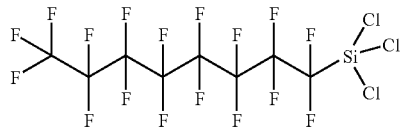

EXAMPLE 25 (MAKING A COMPOUND I VIA METHOD A)

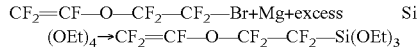

138.47 g (0.500 mol) 2-Bromotetrafluoroethyl trifluorovinyl ether, 13.37 g (0.550 mol) magnesium powder, small amount of iodine (10 crystals) and 362 mL (2.000 mol, 338.33 g) tetraethoxysilane are mixed together at room temperature and diethylether is added dropwise to the vigorously stirred solution until an exothermic reaction is observed (~200 mL). After stirring at room temperature for 16 h diethylether is evaporated. An excess of n-heptane (~400 mL) is added to precipitate the magnesium salts. Solution is filtrated and evaporated to dryness. The residue is fractionally distilled under reduced pressure to yield tetrafluoroethyl trifluorovinyl ether triethoxysilane.

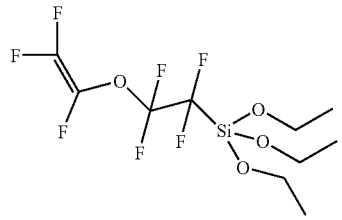

EXAMPLE 26 (MAKING A COMPOUND IV VIA METHOD A)

Follow steps in Example 25, followed by 108.1 g (0.300 mol) tetrafluoroethyl trifluorovinyl ether triethoxysilane, 131 mL (1.800 mol, 214.1 g) thionylchloride and 4.51 g (0.039 mol) pyridinium hydrochloride are refluxed and stirred for 16 h. Excess of $SOCl_2$ is evaporated and tetrafluoroethyl trifluorovinyl ether trichlorosilane is isolated by vacuum-distillation.

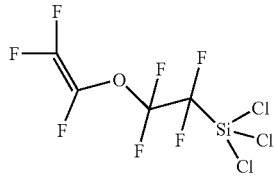

EXAMPLE 27 (MAKING A COMPOUND I VIA METHOD B)

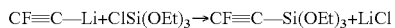

30.80 g (0.155 mol) $ClSi(OEt)_3$ in $Et_2O$ is slowly added to solution of CF≡C—Li (0.155 mol, 7.744 g, prepared in situ) in $Et_2O$ at −78° C. Reaction mixture is stirred overnight allowing it slowly warm to room temperature. LiCl is removed by filtration and solution evaporated to dryness to result fluoroacetylenetriethoxysilane.

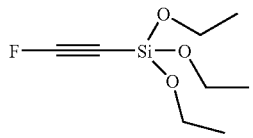

EXAMPLE 28 (MAKING A COMPOUND VIII VIA METHOD C)

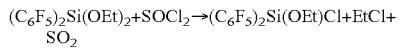

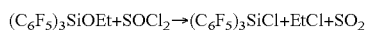

180.93 g (0.400 mol) di(pentafluorophenyl)diethoxysilane, 29 mL (0.400 mol, 47.6 g) thionylchloride and 4.92 g (0.0426 mol) pyridinium hydrochloride are refluxed and stirred for 16 h. Unreacted $SOCl_2$ is evaporated and di(pentafluorophenyl)chloroethoxysilane isolated by vacuum distillation.

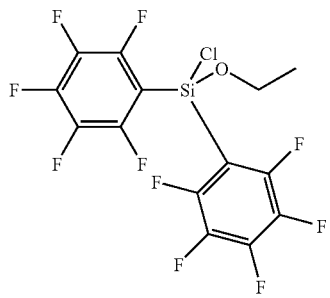

88.54 g (0.200 mol) of di(pentafluorophenyl)chloroethoxysilane in $Et_2O$ is slowly added to solution of $C_6F_5$—Li (0.200 mol, 34.80 g, prepared in situ) in $Et_2O$ at −78° C. The solution is stirred for over night allowing it to warm up to room temperature. Formed clear solution is filtered and evaporated to dryness to result tri(pentafluorophenyl)ethoxysilane, $(C_6F_5)_3SiOEt$.

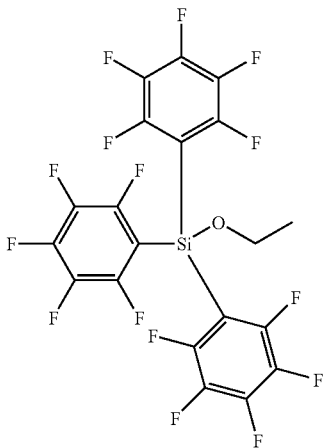

EXAMPLE 29 (MAKING A COMPOUND IX VIA METHOD C)

Follow steps in Example 28, followed by 114.86 g(0.200 mol) tri(pentafluorophenyl)ethoxysilane, 14.6 mL (0.200 mol, 23.8 g) thionylchloride and 2.46 g (0.0213 mol) pyridinium hydrochloride are refluxed and stirred for 16 h. Unreacted $SOCl_2$ is evaporated and tri (pentafluorophenyl)chlorosilane isolated by vacuum-distillation.

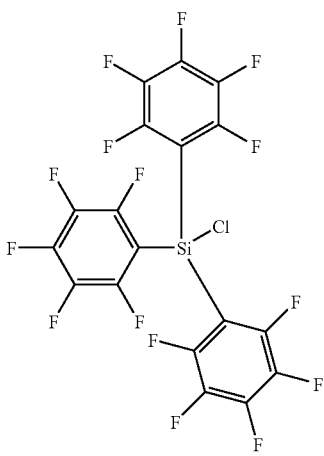

In addition to altering the organic groups in the above examples, it is of course also possible to use other reagents in the methods above. For example, in place of diethyl ether, other solvents such as THF could be used. In place of n-heptane (in Method A) other non polar solvents such as n-hexane could be used. And in place of thionyl chloride (for replacing one or more alkoxy groups with a halogen), chlorine, hydrochloric acid, hydrobromic acid, thionylbromide, chlorine or sulfurylchloride could be used. Also, the temperatures and times (and other process parameters) can be varied as desired. In one example, it is preferred that the molar ratio of the starting material to $R^2X^1$ (Methods B or C) is 0.5:1 to 2:1—preferably 1:1. Also, the starting material and $R^2X^1$ are preferably mixed at a temperature less than −40 C. degrees, e.g., between −50 C. and −100 C. and warmed to a higher temperature over a period of four hours or more (this higher temperature can be room temperature or higher if desired)—or over a longer period of time such as overnight.

As can be seen from the examples above, Methods B and C involve reacting a first compound (having an M group selected from group 14 of the periodic table, 0, 1 or 2 organic groups bound to M) with a second compound (having an element from group 1 of the periodic table and a "new" organic group). As can also be seen from the above, such a reaction can take place if the first compound has alkoxy groups bound to M or both alkoxy and halogens (0, 1 or 2 halogens) bound to M. Method C, as mentioned earlier, is a variation of Method B—and both methods can be viewed as comprising: reacting a compound of the general formula $R^1_{4-m}MOR^3_{m-n}X_n$, where $R^1$ is any nonfluorinated (including deuterated) or partially or fully fluorinated organic group (preferably a partially or fully fluorinated aryl, alkenyl, alkynyl or alkyl group) as set forth above, where M is selected from group 14 of the periodic table, where X is a halogen, where $OR^3$ is an alkoxy group, where m=2 to 4 and n=0 to 2. $R^1_{4-m}MOR^3_{m-n}X_n$ is reacted with $R^2X^1$ where $R^2$ is selected from alkyl, alkenyl, aryl or alkynyl (and where $R^2$ is fluorinated (fully or partially), and where $X^1$ is an element from group 1 of the periodic table. $X^1$ is preferably Na, Li or K, more preferably Na or Li, and most preferably Li. M is preferably Si, Ge or Sn, more preferably Si or Ge, and most preferably Si. X is preferably Cl, Br or I, more preferably Cl or Br, and most preferably Cl. $OR^3$ is preferably an alkoxy group having from 1 to 4 carbon atoms, more preferably from 1 to 3 carbons, and most preferably 2 carbons (ethoxy). Also, "m" is preferably 3 or 4, whereas "n" is preferably 0 or 1.

$R^1$ and $R^2$ are independently preferably partially or fully fluorinated (though not necessarily as can be seen in prior examples) organic groups such as an aryl group (by aryl group we mean any organic group having a ring structure) though preferably a five or six carbon ring that is unsubstituted or substituted. For a six carbon ring structure, 1, 2 or 3 substituents can be bound to the ring, which substituents can be actively bound to the ring via a variation on the Method C set forth above (to be described further below). The substituents can be alkyl groups of any desired length, straight or branched chain, preferably fluorinated, and preferably having from 1 to 4 carbon atoms. Or the substituents on the ring structure can comprise a C=C double bond and be an alkenyl group (by alkenyl group we mean any organic group with a C=C double bond) such as an acrylate, vinyl or allyl group. A fluorinated vinyl, methyl or ethyl group on a fluorinated phenyl group are examples. Or, the aryl group could be a multi ring structure (e.g., perfluoronaphthalene or a biphenyl group). Or $R^1$ and $R^2$ could independently be an alkenyl group such as a vinyl or longer chain group having a C=C double bond, or a group having other types of double bonds (e.g., C=O double bonds or both C=C and C=O double bonds) such as acrylate and methacrylate groups. $R^1$ and $R^2$ could also be an alkynyl group (by alkynyl group we mean any organic group with a carbon-carbon triple bond) as mentioned previously, as well as an alkyl group. If an alkyl group (by alkyl group we mean a carbon chain of any length), preferably the carbon chain is from 1 to 14, and more preferably from 4 to 8. Perfluorinated alkyl groups from 1 to 8 carbons can be used, as well as fluorinated (e.g., partially fluorinated) groups longer than 8 carbons. All the organic groups above could be deuterated in stead of fluorinated (or partially deuterated and partially fluorinated), though fully or partially fluorinated (particularly fully fluorinated) is preferred.

In Method C set forth above, an organic (or hybrid) group "R" (e.g., $R^2$) becomes bound to a group 3-6 or 13-16 element "M" by replacing a halogen "X" bound to "M" via the specified reaction. In an alternative to this method (Method D), an organic (or hybrid) group "R" (e.g., $R^1$) comprises the halogen "X"—preferably Cl or Br (rather than "X" being bound to "M"). Thus, when the reaction is performed, $R^2$ replaces X bound to $R^1$, such that $R^2$ becomes bound to R1 (which is in turn bound to M). Preferably the other groups bound to M are alkoxy groups ($OR^3$) or other organic groups. More particularly, such a method comprises providing a compound $X_a R^1 MOR^3{}_2 R^4$ where a is from 1 to 3, X is a halogen(s) bound to $R^1$, $R^1$ is an organic group (preferably an aryl, alkyl, alkenyl or alkynyl—more preferably an alkyl or aryl group), $OR^3$ is an alkoxy, and $R^4$ is either an additional alkoxy group or an additional organic group (selected from aryl, alkyl, alkenyl or alkynyl), and reacting this compound with $R^2 M^1$ where $M^1$ is selected from group 1 of the periodic table and $R^2$ is an organic group preferably selected from aryl, alkyl, alkenyl and alkynyl, etc., so as to form $R^2{}_a R^1 MOR^3{}_2 R^4$.

In one example, $R^4$ is an alkoxy group the same as $OR^3$, such that the method comprises reacting $X_a R^1 MOR^3{}_3$ with $R^2 M^1$ to form $R^2{}_a R^1 MOR^3{}_3$ (where $R^1$ and $OR^3$ are bound to M and $R^2$ is bound to $R^1$. In another example, $R^4$ is an organic group selected from aryl, alkyl, alkenyl and alkynyl. Preferably $OR^3$ is a methoxy, ethoxy or propoxy, $R^1$ is an aryl or alkyl (straight or branched chain) having from 1 to 14 carbons, and $R^2$ is an aryl, alkyl, alkenyl or alkynyl, where a=1 or 2 if $R^1$ is an alkyl and a=1, 2 or 3 if $R^1$ is an aryl group. $R^2$ can be an epoxy, acrylate, methacrylate, vinyl, allyl or other group capable of cross linking when exposed to an electron beam or in the presence of a photoinitiator and electromagnetic energy (e.g., UV light).

EXAMPLE A (FORMING A COMPOUND I OR IV VIA METHOD D)

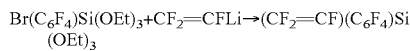

3.

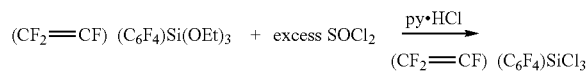

250 g (0.812 mol) 1,4-dibromotetrafluorobenzene, 21.709 g (0.8932 mol) magnesium powder, small amount of iodine (15 crystals) and 181 mL (0.812 mol, 169.164 g) tetraethoxysilane were mixed together at room temperature and diethylether was added dropwise to the vigorously stirred solution until an exothermic reaction was observed (~250 mL). After stirring at room temperature for 16 h diethylether was evaporated. An excess of n-heptane (~600 mL) was added to precipitate the magnesium salts. Solution was filtrated and evaporated to dryness. The residue was fractionally distilled under reduced pressure to yield 4-bromotetrafluorophenyl-triethoxysilane.

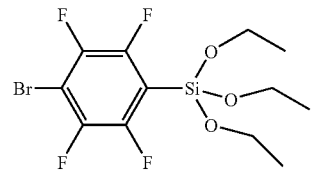

78.246 g (0.200 mol) 4-bromotetrafluorophenyltriethoxysilane in $Et_2O$ is slowly added to solution of $CF_2$=CF—Li (0.200 mol, 17.592 g, prepared in situ) in $Et_2O$ at –78° C. Reaction mixture is stirred overnight while it will slowly warm to room temperature. LiBr is removed by filtration and the product, 4-triethoxysilyl-perfluorostyrene, purified by distillation.

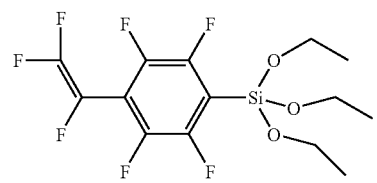

117.704 g (0.300 mol) 4-triethoxysilylperfluorostyrene, 131 mL (1.800 mol, 214.1 g) thionylchloride and 4.51 g (0.039 mol) pyridinium hydrochloride were refluxed and stirred for 16 h. Excess of $SOCl_2$ was evaporated and 4-trichlorosilyl-perfluorostyrene isolated by vacuum-distillation.

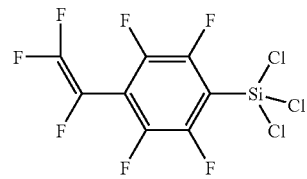

The above example could be modified where 2 or 3 halogens (in this case Br) are bound to the phenyl group so as to result in multiple vinyl substituents. Also, the phenyl group could be another organic group such as an straight or branched chain alkyl group, a multi ring aryl group, etc., whereas the vinyl group could be any suitable organic group capable of binding to a group I element (in the above example Li) and replacing the halogen (in the above example Br). Examples other than vinyl include methyl, ethyl, propyl, phenyl, epoxy and acrylate.

EXAMPLE B (FORMING A COMPOUND I VIA METHOD D)

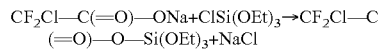

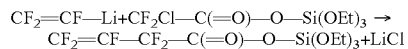

15.246 g (0.10 mol) sodium chlorodifluoroacetate, is dissolved to 100 mL $Et_2O$ and cooled to –70° C. 19.7 mL (0.10 mol, 19.872 g) chlorotriethoxysilane in $Et_2O$ (50 mL)

was added dropwise to reaction solution. The solution was stirred for over night allowing it to warm up to room temperature. NaCl is removed by filtration and solution evaporated to dryness to result clear colourless liquid, chlorodifluoroacetic acid, triethoxysilyl ester.

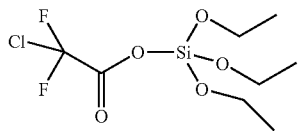

29.27 g (0.10 mol) chlorodifluoroacetic acid, triethoxysilyl ester, is dissolved to 100 mL Et$_2$O and slowly added to solution of CF$_2$=CF—Li (0.10 mol, 8.796 g, prepared in situ) in Et$_2$O at −78° C. Reaction mixture is stirred overnight allowing it slowly warm to room temperature. LiCl is removed by filtration and solution evaporated to dryness to result yellow liquid, crude perfluoro-3-butene acid, triethoxysilyl ester.

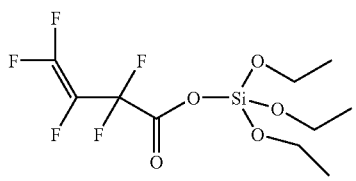

EXAMPLE C (FORMING A COMPOUND I OR IV VIA METHOD D)

Br(C$_6$F$_4$)Si(OEt)$_3$+C$_6$F$_5$—Li→C$_6$F$_5$—C$_6$F$_4$—Si(OEt)$_3$+LiBr

C$_6$F$_5$—C$_6$F$_4$—Si(OEt)$_3$+excess SOCl$_2$ $\xrightarrow{py \cdot HCl}$ C$_6$F$_5$—C$_6$F$_4$—SiCl$_3$ 78.246 g (0.200 mol) 4-bromotetrafluorophenyltriethoxysilane in Et$_2$O is slowly added to solution of C$_6$F$_5$—Li (0.200 mol, 34.80 g, prepared in situ) in Et$_2$O at −78° C. Reaction mixture is stirred overnight while it will slowly warm to room temperature. LiBr is removed by filtration and the product, perfluorobiphenyltriethoxysilane, purified by distillation.

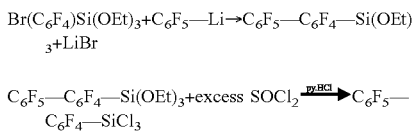

143.516 g (0.300 mol) perfluorobiphenyltriethoxysilane, 131 mL (1.800 mol, 214.1 g) thionylchloride and 4.51 g (0.039 mol) pyridinium hydrochloride were refluxed and stirred for 16 h. Excess of SOCl$_2$ was evaporated and perfluorobiphenyltrichlorosilane isolated by vacuum-distillation.

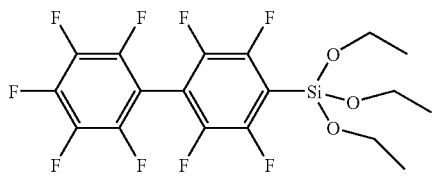

EXAMPLE D (FORMING A COMPOUND I OR IV VIA METHOD D)

1,4-Br$_2$C$_4$F$_8$+Mg+Si(OEt)$_4$→Br(CF$_2$)$_4$Si(OEt)$_3$

Br(CF$_2$)$_4$Si(OEt)$_3$+CF$_2$=CFLi→CF$_2$=CF—(CF$_2$)$_4$—Si(OEt)$_3$

CF$_2$=CF—(CF$_2$)$_4$—Si(OEt)$_3$ + excess SOCl$_2$ $\xrightarrow{py \cdot HCl}$ CF$_2$=CF—(CF$_2$)$_4$—SiCl$_3$ 143.94 g (0.40 mol) 1,4-dibromooctafluorobutane, 10.69 g (0.44 mol) magnesium powder, small amount of iodine (15 crystals) and 88 mL (0.40 mol, 82.42 g) tetraethoxysilane were mixed together at room temperature and diethylether was added dropwise to the vigorously stirred solution until an exothermic reaction was observed (~200 mL). After stirring at room temperature for 16 h diethylether was evaporated. An excess of n-heptane (~400 mL) was added to precipitate the magnesium salts. Solution was filtrated and evaporated to dryness. The residue was fractionally distilled under reduced pressure to yield 4-bromooctafluorobutanetriethoxysilane.

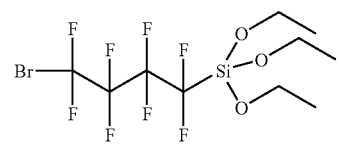

88.641 g (0.200 mol) 4-bromooctafluorobutanetriethoxysilane in Et$_2$O is slowly added to solution of CF$_2$=CF—Li (0.200 mol, 17.592 g, prepared in situ) in Et$_2$O at −78° C. Reaction mixture is stirred overnight while it will slowly warm to room temperature. LiBr is removed by filtration and the product, perfluoro-1-hexenetriethoxysilane, purified by distillation.

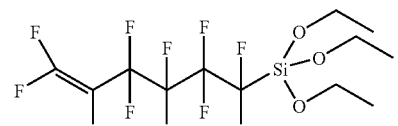

133.295 g (0.300 mol) perfluoro-1-hexenetriethoxysilane, 131 mL (1.800 mol, 214.1 g) thionylchloride and 4.51 g (0.039 mol) pyridinium hydrochloride were refluxed and stirred for 16 h. Excess of SOCl$_2$ was evaporated and perfluoro-1-hexenetrichlorosilane isolated by vacuum-distillation.

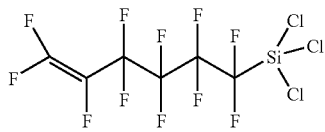

In the above "Method D" examples, $R^1$, $R^2$, $R^3$ and $R^4$ are preferably partially or fully fluorinated.

Other Anti-Stiction Examples

In the present invention, fluorinated silanes, preferably silanes with fully or partially fluorinated aromatic groups or polycyclic groups can be used. Some preferred examples include perfluoromonophenyltrichlorosilane, perfluorodiphenyldichlorosilane, pefluorotriphenylmonochlorosilane, perfluoromonophenylalkoxysilane, perfluorodiphenyidichlalkoxysilane and pefluorotriphenylmonoalkoxysilane.

Perfluoromonophenyltrichlorosilane is illustrated below:

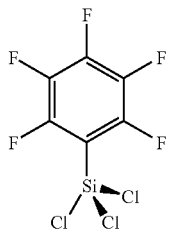

The use of partially fluorinated materials are also part of the invention, as mentioned earlier. In this case, hydrogen can substitute for the missing fluorine. Also, acyl, acyloxy and —OH groups can be provided in place of the halogen and alkoxy groups in the examples above.

Application of the proposed materials to the surfaces may be accomplished by several methods, including, but not limited to the following: 1) Vapor phase deposition; 2) Spin-on (or spray or dip coating) of the chemical with or without a dilution; or 3) Delivery within a supercritical fluid. Preferred is spin or spray on as a low molecular weight oligomer or monomer within a solvent.

Mechanistically, once the chemical comes in contact the surface, the reactive group (e.g. chlorine or alkoxy groups) may be liberated, leaving the remaining silane molecule attached to the surface via Si bonding. Hydrogen-terminated surfaces are known to abet the reaction. Moisture can be added if desired to increase the hydrolysis/condensation.

Vapor phase deposition of monolayers are well known in the art for anti-sticition treatment of a MEMS device. Such known methods can be used for applying the materials in the present invention. Also, compounds having fluorinated phenyl groups can be hyrdrolyzed and condensed as a hydrophobic organic-inorganic material such as set forth in Exhibit A attached hereto.

Hydrolysis and Condensation of the Compound(s):

Compounds IV, VII and IX have organic (or hybrid) R group(s) and halogen(s) (preferably Br or Cl) bound to M (selected from groups 3-6 or 13-16—preferably group 14)). These compounds can be hydrolyzed alone or in any combination to result in a material having a -M-O-M-O- backbone with R groups bound to the backbone, and that preferably has a molecular weight of from 500 to 100,000. In one example, a compound selected from Compound IV is hydrolyzed with another compound selected from Compound IV. In another example, a single compound from Compound VII is hydrolyzed. Many other combinations are possible, including: a) Compound IV+Compound VII; b) Compound IV+Compound IV+Compound IV; c) Compound VII+Compound VII; d) Compound IV+Compound VII+Compound IX; e) Compound IV+Compound IV+Compound IX; f) Compound VII+Compound IX, etc. Any other combinations, in any desired ratio, can be used for the hydrolysis and eventual deposition.

The hydrolysis/condensation procedure can comprise five sequential stages: Dissolve, hydrolysis and co-condensation, neutralization, condensation and stabilization. Not all stages are necessary in all cases. In the hydrolysis, chlorine atoms are replaced with hydroxyl groups in the silane molecule. The following description takes as an example compounds that have chlorine as the halogen that takes part in the hydrolysis reaction, and silicon is the metal in the compound. Hydrochloric acid formed in the hydrolysis is removed in the neutralization stage. Silanols formed in the hydrolysis are attached together for a suitable oligomer in the condensation stage. The oligomer formed in the condensation are stabilized in the end. Each stage can be done with several different ways.

EXAMPLE I

Dissolving. Chlorosilanes are mixed together in an appropriate reaction container and the mixture is dissolved into a suitable solvent like tetrahydrofuran. Instead of tetrahydrofuran as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methylisobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. The reaction mixture is cooled to 0° C. The hydrolysis is performed by adding water ($H_2O$) into the reaction mixture. The water is added in 1:4 (volume/volume) water-tetrahydrofuran-solution. Water is used equimolar amount as there are chlorine atoms in the starting reagents. The reaction mixture is held at 0° C. temperature during the addition. The reaction mixture is stirred at room temperature for 1 hour after addition. Instead of tetrahydrofuran water used in the reaction can be dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used. Neutralization. The reaction mixture is neutralized with pure sodium hydrogen carbonate. $NaHCO_3$ is added into cooled reaction mixture at 0° C. temperature (NaHCO$_3$ is added equimolar amount as there is hydrochloric acid in the reaction mixture). The mixture is stirred at the room temperature for a while. After the pH of the reaction mixture has reached value 7, the mixture is filtered. The solvent is then evaporated with rotary evaporator.

Instead of sodium hydrogen carbonate (NaHCO$_3$) neutralization (removal of hydrochlorid acid) can be performed using following chemicals: pure potassium hydrogen carbonate (KHCO$_3$), ammonium hydrogen carbonate (NH$_4$HCO$_3$), sodium carbonate (Na$_2$CO$_3$), potassium carbonate (K$_2$CO$_3$), sodium hydroxide (NaOH), potassium hydroxide (KOH), calcium hydroxide (Ca(OH)$_2$), magnesium hydroxide (Mg(OH)$_2$) ammonia (NH$_3$), trialkylamines (R$_3$N, where R is hydrogen or straight/branched chain C$_x$H$_y$, x<10, as for example in triethylamine, or heteroatom containing as for example in triethanol amine), trialkyl ammonium hydroxides (R$_3$NOH, R$_3$N, where R is hydrogen or straight/branched chain C$_x$H$_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, methylcyclohexane, chlorobenzene. The solution is extracted several times with water or D$_2$O until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Neutralization stage in cases where condensation stage is passed: In the neutralization stage evaporation of the solvent in the end is not necessary always. In these cases this stage is aborted after filtering (the reaction mixture is neutral) and the synthesis is continued in stabilization stage (the condensation stage is passed).

Condensation. The material is stirred with magnetic stirrer bar under 12 mbar pressure for few hours. Water, which forms during this final condensation, evaporates off. The pressure in this stage can be in a large range. The material can be heated while vacuum treatment. Molecular weight of formed polymer can be increased in this stage by using base or acid catalyzed polymerizations. Procedure for acid catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of acid such as: triflic acid, monofluoro acetic acid, trifluoro acetic acid, trichloro acetic acid, dichloro acetic acid, monobromo acetic acid. The solution is refluxed for few hours or until polymerization is reached desired level while water formed in the reaction is removed. After polymerization, acid catalyst is removed from the material solution completely for example using solvent extraction or other methods described in alternative neutralization section. Finally solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally solvent is removed.

Stabilization. The material is dissolved into cyclohexanone, which is added 99 weight-% of the materials weight. The pH of the solution is adjusted to value 2,0 with acetic acid. In the place of cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro iso-propanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic acid, formic acid, propanoic acid, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methyl pyrrolidone.

In Example I above, "chlorosilanes" are initially mixed together with tetrahydrofuran. As mentioned earlier, this can be an almost unlimited number and type of compounds as disclosed in detail earlier herein—including a large number of chlorosilanes and other halo-metal-organic compounds in accordance with the invention and in accordance with the ultimate properties desired in the final material. If one of the compounds to be hydrolyzed and condensed is pentafluorophenyltrichlorosilane, this can be prepared as in the methods set forth above, by:

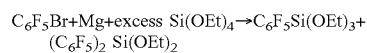

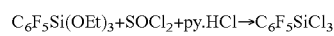

100 mL (0.8021 mol, 198.088 g) pentafluorobromobenzene, 24.90 g (1.024 mol) magnesium powder and 716 mL (3.2084 mol, 668.403 g) tetraethoxysilane are mixed together at room temperature and diethylether is added dropwise to the vigorously stirred solution until an exothermic reaction is observed (~200 mL). After stirring at 35° C. for 16 h the mixture is cooled to room temperature and diethylether evaporated. An excess of n-heptane (~500 mL) is added to precipitate the magnesium salts. Solution is filtrated and evaporated to dryness. The residue is fractionally distilled under reduced pressure to yield pentafluorophenyltriethoxysilane.

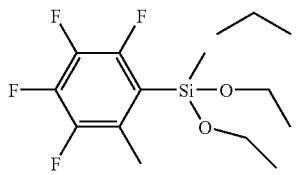

100 mL (0.375 mol, 124.0 g) pentafluorophenyltriethoxysilane, 167 mL (2.29 mol, 272.0 g) thionylchloride and 5.63 g (0.0487 mol) pyridinium hydrochloride are refluxed and stirred for 24 h. Excess of SOCl$_2$ is evaporated and pentafluorophenyltrichlorosilane

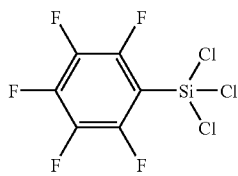

isolated by vacuum-distillation.

If a second of the compounds to be hydrolyzed and condensed is trifluorovinyltrichlorosilane, this can be prepared by:

119 mL (0.155 mol) sec-butyllithium (1.3 M solution in cyclohexane) is added under argon with stirring to 18.053 g (0.155 mol) chlorotrifluoroethylene

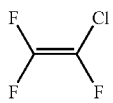

dissolved in Et$_2$O at −80° C. After the addition is complete the reaction mixture is stirred for 15 min to yield lithiumtrifluoroethylene.

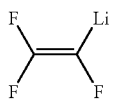

30.80 g (0.155 mol) ClSi(OEt)$_3$ in Et$_2$O is slowly added to solution of CF$_2$=CF—Li (0.155 mol, 13.633 g, prepared in situ) in Et$_2$O at −78° C. Reaction mixture is stirred overnight while it will slowly warm to room temperature. LiCl is removed by filtration and the product, trifluorovinyltriethoxysilane,

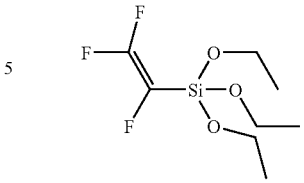

is isolated by distillation.

24.4 g (0.100 mol) trifluorovinyltriethoxysilane, 44 mL (0.60 mol, 71.4 g) thionylchloride and 0.497 g (0.0045 mol) pyridinium hydrochloride are refluxed and stirred for 24 h. Excess of SOCl$_2$ is evaporated and trifluorovinyltrichlorosilane

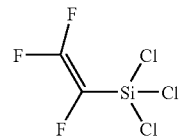

is purified by distillation.

Then, to a solution of trifluorovinyltrichlorosilane and pentafluorophenyltrichlorosilane at a molar ratio 1:1 in dehydrated tetrahydrofuran, is added dropwise a stoichiometric amount of water (e.g., H2O or D2O) in THF at 0° C. (nonstoichiometric amounts, higher or lower, can also be used). After stirring for 1 hour, the solution is neutralized with 3 equivalents of sodium hydrogencarbonate. After confirming the completion of generation of carbonic acid gas from the reaction solution, the solution is filtered and volatile compounds are removed by vacuum evaporation to obtain colorless, transparent viscous liquid, poly(pentafluorophenyltrifluorovinyl-siloxane), in a three dimensional network of alternating silicon and oxygen atoms.

EXAMPLE II

Dissolving. Vinyl trichlorosilane (64.89 g, 402 mmol, 50 mol %) and phenyl trichlorosilane (85.00 g, 402 mmol, 50 mol %) are dissolved in dehydrated THF.

Hydrolysis. The solution is cooled down to 0° C. Water (43.42 g, 2.41 mol, 300 mol %) is added slowly dropwise in THF (1:4 V:V) into stirred solution. The solution is then stirred for 1 hour at the room temperature.

Neutralization. The solution is cooled down to 0° C. and sodium hydrogen carbonate (202.53 g, 2.41 mol, 300 mol %) is added slowly. The solution is stirred after addition at the room temperature until pH of the mixture is neutral.

Condensation. The solution is then filtered and solvents are evaporated with rotary evaporator. After evaporation the mixture is stirred at the room temperature under high vacuum until refractive index of the material is 1.5220.

Stabilization. After vacuum treatment dehydrated THF (5 w-%) and MIBK (94 w-%) are added into the material for solvents and the material is dissolved. Appropriate initiators are added and dissolved into the mixture. Finally, the material is filtered.

Alternative Procedures for Each Stage:

Dissolve. Instead of tetrahydrofuran (THF) as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate ($NaHCO_3$) neutralization (removal of hydrochlorid acid) can be performed using following chemicals: pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, mehylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Condensation. The pressure in this stage can be in a large range. The material can be heated while vacuum treatment. Molecular weight of formed polymer can be increased in this stage by using base or acid catalyzed polymerizations. Procedure for acid catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of acid such as: triflic acid, monofluoro acetic acid, trifluoro acetic acid, trichloro acetic acid, dichloro acetic acid, monobromo acetic acid. The solution is refluxed for few hours or until polymerization is reached desired level while water formed in the reaction is removed. After polymerization, acid catalyst is removed from the material solution completely for example using solvent extraction or other methods described in alternative neutralization section. Finally solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally solvent is removed.

Stabilization. In the place of THF and MIBK can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro iso-propanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic acid, formic acid, propanoic acid, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methyl pyrrolidone.

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as 1,4-bis (pentafluorobenzoyl)benzene or Rhodosil 2074. Thermal initiators which can be used are benzoyl peroxide, 2,2'-azobisisobutyronitrile, 1,1'-Azobis(cyclohexanecarbo-nitrile), tert-butyl hydroperoxide, Dicumyl peroxide and Lauroyl peroxide.

EXAMPLE III

Dissolve. Pentafluorophenyl vinyl dichlorosilane (54.85 g, 187 mmol, 58 mol %), pentafluorophenyl trichlorosilane (24.32 g, 81 mmol, 25 mol %), acryloxypropyl trichlorosilane (5.59 g, 23 mmol, 7 mol %) and dimethyl dimethoxysilane (3.88 g, 32 mmol, 10 mol %) are dissolved in dehydrated THF.

Hydrolysis. The solution is cooled down to 0° C. and water (12.32 g, 684 mmol, 212 mol %) is added dropwise in THF (1:4 V:V) into stirred solution. The solution is stirred for 1 hour at the room temperature after addition.

Neutralization. The solution is cooled down to 0° C. Sodium hydrogen carbonate (57.46 g, 684 mmol, 212 mol %) is added slowly into this mixed solution. The solution is stirred after addition at the room temperature until pH of the mixture is neutral.

Condensation. The solution is then filtered and solvents are evaporated. After evaporation the mixture is stirred under high vacuum until refractive index of the material is 1.4670.

Stabilization. After vacuum treatment dehydrated THF (5 w-%) and cyclohexanone (94 w-%) are added for solvents and the material is dissolved. The solution is acidified to pH value 2.0. Appropriate initiators are added and dissolved into the mixture. Finally, the material is filtered.

Alternative Procedures for Each Stage:

Dissolve. Instead of tetrahydrofuran (THF) as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate ($NaHCO_3$) neutralization (removal of hydrochlorid acid) can be performed using following chemicals: pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, mehylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Condensation. The pressure in this stage can be in a large range. The material can be heated while vacuum treatment. Molecular weight of formed polymer can be increased in this stage by using base or acid catalyzed polymerizations. Procedure for acid catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of acid such as: triflic acid, monofluoro acetic acid, trifluoro acetic acid, trichloro acetic acid, dichloro acetic acid, monobromo acetic acid. The solution is refluxed for few hours or until polymerization is reached desired level while water formed in the reaction is removed. After polymerization, acid catalyst is removed from the material solution completely for example using solvent extraction or other methods described in alternative neutralization section. Finally solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally, solvent is removed.

Stabilization. In the place of THF and cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro isopropanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic acid, formic acid, propanoic acid, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methyl pyrrolidone.

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as 1,4-bis (pentafluorobenzoyl)benzene or Rhodosil 2074. Thermal initiators which can be used are benzoyl peroxide, 2,2'-azobisisobutyronitrile, 1,1'-Azobis(cyclohexanecarbo-nitrile), tert-butyl hydroperoxide, Dicumyl peroxide and Lauroyl peroxide.

EXAMPLE IV

Dissolve. Pentafluorophenyl vinyl dichlorosilane (122.96 g, 420 mmol, 58 mol %), pentafluorophenyl trichlorosilane (54.54 g, 181 mmol, 25 mol %), acryloxypropyl trichlorosilane (12.54 g, 51 mmol, 7 mol %) and di(pentafluorophenyl) dichlorosilane (31.33 g, 72 mmol, 10 mol %) are dissolved in dehydrated THF.

Hydrolysis. The solution is cooled down to 0° C. and water (30.27 g, 1.68 mol, 232 mol %) is added dropwise in THF (1:4 V:V) into stirred solution. The solution is then stirred for 1 hour at the room temperature.

Neutralization. The solution is cooled down to 0° C. and sodium hydrogen carbonate (140.97 g, 1.68 mol, 232 mol %) is added slowly. The solution is stirred after addition at the room temperature until pH of the mixture is neutral.

Condensation. The solution is then filtered and solvents are evaporated. After evaporation the mixture is stirred under high vacuum until refractive index of the material is 1.4705.

Stabilization. After vacuum treatment dehydrated THF (5 w-%) and cyclohexanone (94 w-%) are added for solvents and the material is dissolved. The solution is acidified to pH value 2.0 with trifluoro acetic acid. Appropriate initiators are added and dissolved into the mixture. Finally, the material is filtered.

Alternative Procedures for Each Stage:

Dissolve. Instead of tetrahydrofuran (THF) as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate ($NaHCO_3$) neutralization (removal of hydrochlorid acid) can be performed using following chemicals: pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, mehylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Condensation. The pressure in this stage can be in a large range. The material can be heated while vacuum treatment. Molecular weight of formed polymer can be increased in this stage by using base or acid catalyzed polymerizations. Procedure for acid catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of acid such as: triflic acid, monofluoro acetic acid, trifluoro acetic acid, trichloro acetic acid, dichloro acetic acid, monobromo acetic acid. The solution is refluxed for few hours or until polymerization is reached desired level while water formed in the reaction is removed. After polymerization, acid catalyst is removed from the material solution completely for example using solvent extraction or other methods described in alternative neutralization section. Finally, solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally, solvent is removed.

Stabilization. In the place of THF and cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro isopropanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic acid, formic acid, propanoic acid, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methyl pyrrolidone.

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as 1,4-bis(pentafluorobenzoyl)benzene or Rhodosil 2074. Thermal initiators which can be used are benzoyl peroxide, 2,2'-azobisisobutyronitrile, 1,1'-Azobis(cyclohexanecarbonitrile), tert-butyl hydroperoxide, Dicumyl peroxide and Lauroyl peroxide.

EXAMPLE V

Dissolve. Pentafluorophenyl vinyl dichlorosilane (90.00 g, 307 mmol, 60 mol %), pentafluorophenyl trichlorosilane (38.59 g, 128 mmol, 25 mol %) and di(pentafluorophenyl) dichlorosilane (33.25 g, 77 mmol, 15 mol %) are dissolved in dehydrated THF.

Hydrolysis. The solution is cooled down to 0° C. and water (20.72 g, 1.15 mol, 225 mol %) is added dropwise in THF (1:4 V:V) into this stirred solution. The solution is then stirred for 1 hour at the room temperature.

Neutralization. The solution is cooled down to 0° C. and sodium hydrogen carbonate (96.74 g, 1.15 mol, 225 mol %) is added slowly. The solution is stirred after addition at the room temperature until pH of the mixture is neutral.

Condensation. The solution is then filtered and solvents are evaporated. After evaporation the mixture is stirred under high vacuum until refractive index of the material is 1.4715.

Stabilization. After vacuum treatment dehydrated THF (5 w-%) and cyclohexanone (94 w-%) are added for solvents and the material is dissolved. The solution is acidified to pH value 2.0 with trifluoro acetic acid. Appropriate initiators are added and dissolved into the mixture. Finally, the material is filtered.

Alternative Procedures for Each Stage:

Dissolve. Instead of tetrahydrofuran (THF) as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate ($NaHCO_3$) neutralization (removal of hydrochlorid acid) can be performed using following chemicals: pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent—extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, mehylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Condensation. The pressure in this stage can be in a large range. The material can be heated while vacuum treatment. Molecular weight of formed polymer can be increased in this stage by using base or acid catalyzed polymerizations. Procedure for acid catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of acid such as: triflic acid, monofluoro acetic acid, trifluoro acetic acid, trichloro acetic acid, dichloro acetic acid, monobromo acetic acid. The solution is refluxed for few hours or until polymerization is reached desired level while water formed in the reaction is removed. After polymerization, acid catalyst is removed from the material solution completely for example using solvent extraction or other methods described in alternative neutralization section. Finally, solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally, solvent is removed.

Stabilization. In the place of THF and cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro iso-propanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic acid, formic acid, propanoic acid, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methyl pyrrolidone.

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as 1,4-bis (pentafluorobenzoyl)benzene or Rhodosil 2074. Thermal initiators which can be used are benzoyl peroxide, 2,2'-azobisisobutyronitrile, 1,1'-Azobis(cyclohexanecarbo-nitrile), tert-butyl hydroperoxide, Dicumyl peroxide and Lauroyl peroxide.

Example I above is but one example of a method comprising: reacting a compound of the general formula $R1MX3_3$ with a compound of the general formula $R2MX3_3$ where R1 is selected from alkyl, alkenyl, aryl and alkynyl, R2 is selected from alkenyl, aryl or alkynyl, M is an element selected from groups 3-6 or 13-16 though preferably from group 14 of the periodic table, and X3 is a halogen; with $H2O$ or $D2O$; so as to form a compound having a molecular weight of from 500 to 100,000 with a -M-O-M-O- backbone with R1 and R2 substituents on each M. In the hydrolysis example above, silicon atoms of the network are modified by pentafluorophenyl and trifluorovinyl groups in an approximate ratio 1:1. Of course other ratios are possible depending upon the ratio of starting materials, and, of course, other three dimensional networks can be achieved by having other (or additional) starting materials selected from Compound IV, VII and IX, along with other hydrolyzable materials. An alternate example is a method comprising: reacting a compound of the general formula $R1R2MX3_2$ where R1 is selected from alkyl, alkenyl, aryl and alkynyl, R2 is selected from alkenyl, aryl or alkynyl, M is an element selected from group 14 of the periodic table, and X3 is a halogen; with $D2O$; so as to form a compound having a molecular weight of from 500 to 100,000 with a -M-O-M-O- backbone with R1 and R2 substituents on each M. As mentioned above, Compounds IV, VII and IX have organic (or hybrid) R group(s) and halogen(s) (preferably Br or Cl) bound to M (selected from groups 3-6 or 13-16—preferably group 14)) and can be combined in almost limitless combinations—e.g., a compound selected from the Compound IV group could be hydrolyzed with another compound selected from Compound IV. In another example, a single compound from Compound VII is hydrolyzed. Many other combinations are possible, including: Compound IV+Compound VII; Compound IV+Compound IV+Compound IV; Compound VII+ Compound VII; Compound IV+Compound VII+Compound IX; Compound IV+Compound IV+Compound IX; Compound VII+Compound IX, etc.—which various combinations of compounds will result in a hydrolyzed material having at least one organic substituent bound to an inorganic oxide backbone—preferably from 2 to 6 different organic substituents bound to the backbone prior to deposition and exposure. The presence of the organic groups, preferably all fluorinated, allows for improved optical absorption characteristics due to minimal or absent C—H bonds in the deposited material (preferably the hydrolyzed/condensed material has a hydrogen content of 10% or less, preferably 5% or less, and more preferably 1% or less).

Also, though "M" in the above hydrolysis example is silicon, it is possible to have materials with other M groups, or "dope" one or more silanes to be hydrolyzed with a lesser (though not necessarily lesser) amount of a compound having a different M group such as boron, a metalloid and/or an early transition metal (e.g., B, Al, Si, Ge, Sn, Sb, Pb, Ta, Ti, Zr, Er, Yb and/or Nb). As an example, a material could be formed from hydrolyzing/condensing one or more compounds each formed of silicon, chlorine and one or more fluorinated organic compounds bound to the silicon, whereas another material could be formed by hydrolyzing/condensing such compound with one or more additional compounds that each comprise an element other than silicon (Ge, Nb, Yb etc.), chlorine and one or more fluorinated organic groups. In this way, the inorganic backbone of the hydrolyzed/condensed material will comprise silicon, oxygen and the element(s) other than silicon, with fluorinated organic groups bound to this backbone.

Though halogen (e.g., chlorine) and alkoxy (e.g., ethoxy) groups are disclosed herein as the groups bound to the "M" group (e.g., silicon) via which hydrolysis occurs, it should be noted that for some of the compounds mentioned herein, an OH group could be bound to M followed by hydrolysis and deposition as will be discussed below.

Deposition of the Hydrolyzed and Condensed Material on the MEMS Device:

The material formed as above preferably has a molecular weight between 500 and 100,000. The material is deposited on a MEMS device formed on a substrate—preferably a released (sacrificial layer already removed) device. In general, the siloxane oligomer—the hybrid organic-inorganic anti-stiction material having the molecular weight as set forth above—is mixed with a suitable solvent and deposited. Or, as mentioned above, a silane monomer could instead be mixed with the solvent. The solvent can be any suitable solvent, such as isopropanol, ethanol, methanol, THF, mesitylene, toluene, cyclohexanone, cyclopentanone, dioxane, methyl isobutyl ketone, or perfluorinated toluene.

Deposition is generally at a temperature of 200 C. or less (can be at 150 C. or less). If the material is annealed after deposition, it is preferably at 200 C. or less. If the material is to be patterned by exposure to electromagnetic radiation (e.g., UV light) then a photoinitiator can be mixed into the material along with the solvent. There are many suitable types of photoinitiators that could be used, such as Irgacure 184, Irgacure 500, Irgacure 784, Irgacure 819, Irgacure 1300, Irgacure 1800, Darocure 1173 or Darocure 4265. The initiator could be highly fluorinated, such as 1,4-bis(pentafluorobenzoyl)benzene or Rhodosil 2074 photoinitiator. Also, thermal initiators can be applied for thermal crosslinking of organic carbon double bond moieties, such as with Benzoyl peroxide, 2,2'-Azobisisobutyronitrile, or tert-Butyl hydroperoxide. The amount of these photo or thermal initiators may vary from 0.1 to 5 w-%. They may appear in solid or liquid phase. The initiator is carefully mixed with the material that already contains "processing solvent". (Organic dopants or liquid crystal dopants—or erbium—can be mixed with the material at this point if desired.) Finally, the material is filtered through inert semiconductor grade filter to remove all undissolved material.

Spin-on processing. After hydrolysis and condensation, the material solution is deposited on a MEMS device on a substrate in a spin-on process (or by dipping, spray and meniscus coating, etc.). Both static and dynamic deposition can be used. The material is first spread over a wafer or other substrate at low speed (50 to 700 rpm) for 5 to 10 seconds and then the speed is increased by 500 to 5000 rpm/s acceleration to 1000 rpm or higher depending upon starting speed. However, slower speeds may be used if very thick films are required. Thicker films may be desired as an undercoating prior to forming the MEMS structures. If 1000 rpm spinning speed is applied film thicknesses from 100 nm to 30,000 nm are achieved depending on material viscosity. Material viscosity can be tuned by increasing the amount of process solvent, which typically have relative low vapor pressure and high boiling point. Spinning is continued for 30 to 60 seconds to obtain uniform film over the wafer. After the spinning, an edge bead removal process is accomplished and the wafer is pre-baked (in nitrogen on hot-plate or in furnace) at temperature around 100 Celsius for 1 minute to remove the process solvent (if used) and improve adhesion to the substrate or to the layer underneath of the current material. Adhesion promoter such as 1% aminopropyltrimethoxy silane in IPA or plasma activation may be applied between the main layers to improve adhesion between them.

The substrate on which the MEMS structures are formed can be any suitable substrate or article. In many cases, the substrate will be a planar wafer-type substrate, such as a glass, plastic, quartz, sapphire, ceramic or a semiconductor substrate (e.g., germanium or silicon). The substrate can have electronic or photonic circuitry along with the MEMS structures (released or unreleased) already thereon prior to deposition of the anti-stiction material of the invention. In the present invention, a silicon wafer can be used as the substrate on which is formed the MEMS device—though other substrates can be used.

Deposition Example 1: Add 10 w-% of methyl isobutyl ketone and 1 w-% of Darocure 1173 photoinitiator to result in the formation of a spin-coatable and photo-sensitive material. The material is deposited by spin coating, spray coating, dip coating, etc. onto a substrate or other article of manufacture. As mentioned herein, many other organic groups can be used in place of the above groups, though preferably one of the groups in one of the compounds is capable of cross linking when exposed to electromagnetic energy (or an electron beam)—e.g., an organic group with a ring structure (e.g., an epoxy) or a double bond (e.g., vinyl, allyl, acrylate, etc.). And, preferably such a cross linking group is partially or fully fluorinated so that the organic cross linking groups in the material after cross linking will be fluorinated cross linking groups—ideally perfluorocarbon cross linking groups in the finally formed material.

Deposition of Monomeric Precursors on the MEMS Device:

Previously described precursors both organo alkoxysilanes and organo chlorosilanes can also be deposited as monomeric precursors by dissolving the material into a spinning solvent such as 1-propanol, 2-propanol, methyl isobutyl ketone, cyclopentanone and mesitylene. The concentration of the precursor or precursors is 0.001-5 w-% in the solvent and more preferably less than 1 w-%. The material is deposited by spin-coating and by allowing the solvent dry a monolayer of applied material is formed.

Typically it is also preferable that the deposition solution based on the monomeric precursors is made acidic with acetic acid, triflic acid, trifluoro acetic acid, trichloro acetic acid etc., which increases the activity of precursor to form covalent bond between the precursor and the substrate.

Patterning by RIE:

If patterning is desired of the anti-stiction material (and often such will not be necessary or desirable), the patterning can be done by RIE. Or, if in n the above examples, organic cross linking groups (alkenyl, alkynyl, epoxy, acrylic, etc.) are used, the material can be selectively exposed to light or a particle beam so as to further cross link the material in particular areas, followed by removal with developer of non-exposed areas. However, it is also possible to expose the entire material (or write the entire area with a particle beam, or heat the entire article) so as to organically cross link the material in all areas. Then, following standard processing (spin on and developing of photoresist, etc.) the material can be patterned by etching (e.g., RIE or other plasma etch process). In addition, it is possible to deposit and pattern the electrically conductive areas first, followed by deposition (and optional chemical mechanical polishing) of the anti-stiction material of the invention. In addition, it is not necessary to have organic cross linking groups at all. A material having a molecular weight of from 500 to 100,000 (due to partial hydrolysis of precursors as mentioned elsewhere herein) is deposited on a substrate. Then, additional hydrolysis is performed e.g., by heating the material on the substrate so as to cause additional (inorganic) cross linking of the material (i.e., extending the -M-O-M-O three dimensional backbone and substantially increasing the molecular weight). The material can then be chemical-mechanical polished and patterned by RIE or other suitable methods. Alternatively, materials having a lower molecular weight (less than 500) could be used, or silane monomers could be used.

Exposure:

Regardless of the type of MEMS device being coated, it might be desirable to cross link the deposited material. As mentioned above, any suitable cross-linking agent can be used, including common thermal and photo initiators. Assuming that a photoinitiator has been used, then the deposited anti-stiction material acts as a negative tone photoresist, i.e., exposed regions becomes less soluble in a developer. The deposited material can be exposed with any suitable electromagnetic energy, though preferably having a wavelength from 13 nm to 700 nm, including DUV (210-280 nm), mid-UV (280-310 nm), standard I-line or G-line UV-light. DUV exposure is preferred. A stepper can be used for the UV exposure. Typically contact mask exposure techniques are applied. Exposure times may vary between 1 second to several hundred seconds. After the exposure the unexposed areas are removed by soaking the substrate/article (e.g., wafer) or otherwise exposing the substrate/article to a suitable developer (e.g., spray-development may also be used). A developer such as Dow Chemical DS2100, Isopropanol, methyl isobutyl ketone etc. or their combinations can be used to remove unexposed material. Typically 2 minutes development time is used and a solvent rinse (e.g., an ethanol rinse) is preferred to finalize the development. The rinsing removes development residues from the wafer. The adhesion of the exposed structures and the effectiveness of the exposure can be increased by heat-treating the article/substrate (e.g., a slow anneal at elevated temperature—typically less than 200 C.). Other exposure techniques, such as exposure with a laser or with Deep UV, could also be performed in place of the above.

Post-baking process. The final hardening of the material is achieved by baking (in air, nitrogen, argon or helium) the article/substrate for several hours typically at less than 200 C. Step-wise heating ramp-up and ramp-down are preferred. The material can also be fully or partially hardened with deep UV light curing.

In the alternative to the above, the material to be patterned is spun on, prebaked, hard baked (typically less than 200 C). Then standard photoresist and RIE etching techniques are applied.

Material Characteristics:

Material processed and formed on a substrate as above, was tested to determine various characteristics of the deposited and cross-linked material. In a test of the hydrophobicity of the anti-stiction material, a water contact angle measurement can be measured. The phenomenon of wetting or non-wetting of a solid by a liquid can be understood in terms of the contact angle. A drop of a liquid resting on a solid surface forming an angle relative to the surface may be considered as resting in equilibrium by balancing the three forces involved (namely, the interfacial tensions between solid and liquid, that between solid and vapor and that between liquid and vapor). The angle within the liquid phase is known the contact angle or wetting angle. It is the angle included between the tangent plane to the surface of the liquid and the tangent plane to the surface of the solid, at any point along their line of contact. The surface tension of the solid will favor spreading of the liquid, but this is opposed by the solid-liquid interfacial tension and the vector of the surface tension of the liquid in the plane of the solid surface.

In the present invention, contact angles of 90 degrees or more, and generally 100 degrees or more are easily achieved (from 50 ul of ultrapure water). Depending upon the compounds selected for hydrolysis/condensation, water contact angles of 125 degrees or more, or even 150 degrees or more can be achieved. Particularly if all organic groups, including those that provide bulk to the final material (e.g., a longer alkyl chain or a single or multi ring aryl group) as well as those that allow for cross linking (e.g., organic groups with unsaturated double bonds), are fully fluorinated—then the resulting material can be highly hydrophobic and result in very large contact angles. The hydrophobicity can easily be tailored depending upon which compounds are selected, and in what amounts, for hydrolysis/condensation.

Due to the hydrophobic nature of some of the materials within the present invention (e.g., those having a higher degree of fluorination), it may be desirable in some cases to first provide an adhesion promoting layer before depositing the anti-stiction material. For example, a 1:100 dilution of the material of the invention could be applied as an adhesion promoting layer before spinning on (or otherwise depositing) the anti-stiction material. The diluted SOD is very stable (photo, thermal, humidity, 85/85 tests) and easy to detect, spreads well on Silicon and is optically clear all the way to UV. Other adhesion promoting materials that could be used include Onichem organosilane G602, (N(beta aminoethyl)-gamma aminopropyl dimethyl siloxane (CA 3069-29-2)—high boiling, high RI(1.454), thermally stable low density and is compatible with acrylics, silicones, epoxies, and phenolics), or Dow AP8000, propyloxysilane (e.g., 3(2 3 epoxy propoxy propyl) trimethoxy silane), Ormocer (low viscosity), Halar, Orion/Dupont Teflon primer, trifluoroacetic acid, barium acetate, fluorethers (from Cytonix), PFC FSM 660 (a fluoroalkyl monosilane in a fluorinated solvent)—can be diluted to 0.1 to 0.05 percent in alcohol or fluorinated solvent, PFC FSM 1770 (a tri-fluoroalkyl monosilane in a fluorinated solvent, providing very low surface energy to oxide surfaces and good adhesion for fluoropolymers)—can be diluted to 0.1 to 0.05 percent in alcohol or fluorinated solvent, and/or HMDS.

The materials of the invention can be deposited as very thin layers (as thin as from 1 to 10 molecular layers), or in thicker films from 1 nm up to 10 um (or more). The thickness of the deposited layer can be controlled by controlling the material viscosity, solvent content and spinning speed (if deposited by spin on). Material thickness can also be controlled by adjusting the deposition temperature of both the deposition solution and the spinner (if spin on deposition). Also, adjusting the solvent vapor pressure and boiling point by selection of solvent can affect the thickness of the deposited material. Spin on deposition can be performed on a Karl Suss Cyrset enhanced RC8 spinner.

Description. The synthesis of deposition materials is preferably based on hydrolysis and condensation of chlorosilanes (though alkoxysilanes, silanols or other hydrolysable precursors could be used). The synthesis procedure consists of five sequential stages: dissolve, hydrolysis, neutralization, condensation and stabilization. In the hydrolysis chlorine (or other reactive group) atoms are replaced with hydroxyl groups in the silane molecule. Hydrochloric acid formed in the hydrolysis is removed in the neutralization stage. Silanols formed in the hydrolysis are attached together for a suitable oligomer in the condensation stage.

Terminal groups. Compound of the general formula $R_1R_2R_3SiR_4$ can act as a terminal group, wherein $R_1$, $R_2$, $R_3$ are independently (non-fluorinated, partially fluorinated or perfluorinated) aromatic groups (e.g., phenyl, toluene, biphenyl, naphthalene, etc.) or cross linkable groups (e.g., vinyl, allyl, acrylate, styrene, epoxy etc.) or any alkyl group having from 1-14 carbons, wherein $R_4$ is either an alkoxy group, $OR^5$, or a halogen (Br, Cl). Perfluorinated $R_1$, $R_2$ and $R_3$ groups are preferred.

Example Method 1 for Preparation of a Deposition Material with tris(perfluorovinyl)chlorosilane as a Terminal Group:

Dissolve. Tris(perfluorovinyl)chlorosilane, pentafluorophenyltrifluorovinyl dichlorosilane and pentafluorophenyltrichlorosilane are mixed together in molar ratio 1:4:4 in an appropriate reaction flask and the mixture is dissolved into appropriate solvent like tetrahydrofuran.

Hydrolysis and Co-condensation. The reaction mixture is cooled to 0° C. The hydrolysis is performed by adding water ($H_2O$) into the reaction mixture. The water is added as 1:4 (volume/volume) water-tetrahydrofuran-solution. The amount of water used is equimolar with the amount of chlorine atoms in the starting reagents. The reaction mixture is held at 0° C. temperature during the addition. The reaction mixture is stirred at room temperature for 1 hour after addition.

Neutralization. The reaction mixture is neutralized with pure sodium hydrogencarbonate. $NaHCO_3$ is added into cooled reaction mixture at 0° C. temperature (The amount of $NaHCO_3$ added is equimolar with the amount of hydrochloric acid in the reaction mixture). The mixture is stirred at the room temperature for a while. After the pH of the reaction mixture has reached the value 7, mixture is filtered. The solvent is then evaporated with a rotary evaporator.

Condensation. The material is stirred with a magnetic stirrer bar under 12 mbar pressure for few hours. Water, which forms during this final condensation, evaporates off.

Stabilization. The material is dissolved into cyclohexanone, which is added 99 weight-% of the materials weight. The pH of the solution is adjusted to value 2.0 with acetic acid.

Example Method 2 for Preparation of a Deposition Material with bis(pentafluorophenyl)-trifluorovinylchlorosilane as a Terminal Group:

Dissolve. Bis(pentafluorophenyl)trifluorovinylchlorosilane, pentafluorophenyltrifluorovinyldichlorosilane and pentafluorophenyltrichlorosilane are mixed together in molar ratio 1:6:4 in an appropriate reaction flask and the mixture is dissolved into appropriate solvent like tetrahydrofuran. Hydrolysis, neutralization, condensation and stabilization stages are performed as in example method 1.

Example Method 3 for Preparation of a Deposition Material with tris(perfluorotoluene)chlorosilane as a Terminal Group:

Dissolve. Tris(perfluorotoluene)chlorosilane, pentafluorophenyltrifluorovinyl-dichlorosilane and pentafluorophenyltrichlorosilane are mixed together in molar ratio 1:6:8 in an appropriate reaction flask and the mixture is dissolved into appropriate solvent like tetrahydrofuran.

Hydrolysis, neutralization, condensation and stabilization stages are performed as in example method 1.

Alternative Procedures for Each Stage:

Dissolve. Instead of tetrahydrofuran (THF) as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate ($NaHCO_3$) neutralization (removal of hydrochlorid acid) can be performed using following chemicals: pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, mehylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Condensation. The pressure in this stage can be in a large range. The material can be heated while vacuum treatment. Molecular weight of formed polymer can be increased in this stage by using base or acid catalyzed polymerizations. Procedure for acid catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of acid such as: triflic acid, monofluoro acetic acid, trifluoro acetic acid, trichloro acetic acid, dichloro acetic acid, monobromo acetic acid. The solution is refluxed for few hours or until polymerization is reached desired level while water formed in the reaction is removed. After polymerization, acid catalyst is removed from the material solution completely for example using solvent extraction or other methods described in alternative neutralization section. Finally solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally, solvent is removed.

Stabilization. In the place of THF and cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro isopropanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic acid, formic acid, propanoic acid, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methyl pyrrolidone.

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as: 1,4-bis (pentafluorobenzoyl)benzene or Rhodosil 2074 or other suitable initiator. Thermal initiators which can be used are benzoyl peroxide, 2,2'-azobisisobutyronitrile, 1,1'-Azobis (cyclohexanecarbonitrile), tert-butyl hydroperoxide, Dicumyl peroxide and Lauroyl peroxide.

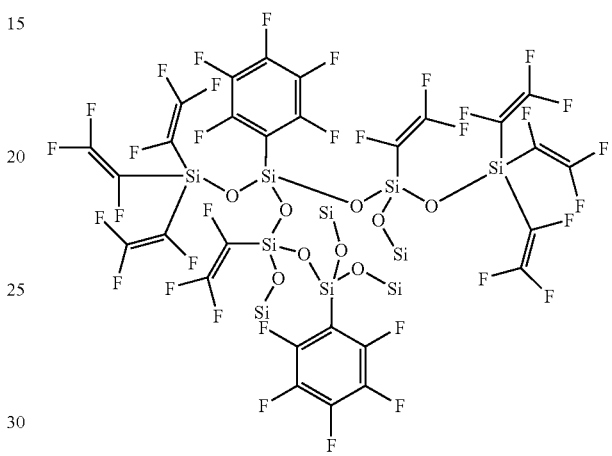

Figure above: Example of oligomeric molecule formed in above type of reactions. (Of course this is but one of many examples of materials formed after hydrolysis of precursors). Also, as mentioned above, a solution of a single monomer (e.g. a flourinated silane with aromatic or aliphatic single or polycyclic ring structures) can be deposited on the MEMS device as well.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

We claim:

1. A MEMS device, comprising:
a substrate;
a movable microelectromechanical structure held on the substrate;
a stop against which the micromechanical structure abuts at its maximum point of movement;
wherein the stop and/or the movable microelectromechanical structure are coated with a layer comprising a siloxane material having a partially or fully fluorinated aromatic ring structure, said layer being formed by hydrolyzing a silane selected from the group consisting of a tetraalkoxysilane, a trialkoxysilane, a trichlorosilane, a dialkoxysilane, and a dichlorosilane, with a compound of the general formula $R^1R^2R^4MR^5$, wherein $R^1$, $R^2$ and $R^4$ are independently an aryl, alkyl, alkenyl, epoxy or alkynyl group, wherein at least one of $R^1$, $R^2$ and $R^4$ is fully or partially fluorinated, wherein M is selected from group 14 of the periodic table, and wherein $R^5$ is either an alkoxy group, $OR^3$ or a halogen, X, followed by depositing the material on the stop and/or the movable microelectromechanical structure.

2. The MEMS device of claim 1, wherein the siloxane material further comprises an alkenyl or alkynyl group.

3. The MEMS device of claim 1, wherein the ring structure is a polycyclic ring structure is a polycyclic ring structure.

4. The MEMS device of claim 1, wherein the siloxane material comprises more than one partially or fully fluorinated ring structures.

5. A MEMS device comprising a stationary structure and a movable structure, the movable structure impacting the stationary structure when actuated and wherein the movable structure and/or the stationary structure are coated with a layer comprising a siloxane material having a partially or fully fluorinated aromatic ring structure and wherein said layer is formed by hydrolyzing a silane selected from the group consisting of a tetraalkoxysilane, a trialkoxysilane, a trichlorosilane, a dialkoxysilane, and a dichlorosilane, with a compound of the general formula $R^1R^2R^4MR^5$, wherein $R^1$, $R^2$ and $R^4$ are independently an aryl, alkyl, alkenyl, epoxy or alkynyl group, wherein at least one of $R^1$, $R^2$ and $R^4$ is fully or partially fluorinated, wherein M is selected from group 14 of the periodic table, and wherein $R^5$ is either an alkoxy group, $OR^3$ or a halogen, X, followed by depositing the material on the MEMS device, followed by depositing the material on the movable structure and/or the stationary structure.

* * * * *